United States Patent
Okuyama

(10) Patent No.: US 7,463,115 B2
(45) Date of Patent: Dec. 9, 2008

(54) HIGH FREQUENCY ELECTRONIC COMPONENT

(75) Inventor: Yuichiro Okuyama, Tokyo (JP)

(73) Assignee: TDK Corporation, Tokyo (JP)

( * ) Notice: Subject to any disclaimer, the term of this patent is extended or adjusted under 35 U.S.C. 154(b) by 361 days.

(21) Appl. No.: 11/487,494

(22) Filed: Jul. 17, 2006

(65) Prior Publication Data

US 2007/0018754 A1  Jan. 25, 2007

(30) Foreign Application Priority Data

Jul. 22, 2005 (JP) ............... 2005-212080

(51) Int. Cl.
*H01P 5/12* (2006.01)
(52) U.S. Cl. ............ 333/126; 333/129; 333/132; 333/125
(58) Field of Classification Search ........ 333/125, 333/126, 129, 132
See application file for complete search history.

(56) References Cited

U.S. PATENT DOCUMENTS

| 6,351,195 | B1 | 2/2002 | Atokawa et al. |
| 2004/0266378 | A1 | 12/2004 | Fukamachi et al. |
| 2006/0094393 | A1 | 5/2006 | Okuyama et al. |
| 2006/0103485 | A1 | 5/2006 | Okuyama et al. |
| 2006/0117163 | A1 | 6/2006 | Okuyama et al. |

FOREIGN PATENT DOCUMENTS

| JP | A 10-145270 | 5/1998 |
| JP | A 11-103229 | 4/1999 |
| JP | A 11-214851 | 8/1999 |
| JP | A 2000-244207 | 9/2000 |
| JP | A 2001-285112 | 10/2001 |
| JP | A 2002-64400 | 2/2002 |
| JP | A 2003-124058 | 4/2003 |
| JP | A 2003-152588 | 5/2003 |
| JP | A 2004-222087 | 8/2004 |
| JP | A-2004-235877 | 8/2004 |
| JP | A-2005-73096 | 3/2005 |
| JP | A 2006-140862 | 6/2006 |
| JP | A 2006-140863 | 6/2006 |
| JP | A 2006-157880 | 6/2006 |

*Primary Examiner*—Robert Pascal
*Assistant Examiner*—Kimberly E Glenn
(74) *Attorney, Agent, or Firm*—Oliff & Berridge, PLC

(57) ABSTRACT

A high frequency electronic component comprises a layered substrate. On the bottom surface of the layered substrate, there are provided a plurality of functional terminals for inputting and outputting signals relating to functions of a circuit inside the layered substrate, a plurality of ground terminals, a plurality of terminals that are not connected to external circuits, and a conductor section for grounding. The conductor section for grounding includes: a center portion located in a region surrounded by a plurality of terminals; and a plurality of coupling portions for coupling the center portion to the terminals.

8 Claims, 22 Drawing Sheets

HIGH FREQUENCY ELECTRONIC COMPONENT

BACKGROUND OF THE INVENTION

1. Field of the Invention

The present invention relates to a high frequency electronic component incorporating a layered substrate and a plurality of terminals disposed on a bottom surface of the layered substrate.

2. Description of the Related Art

As high frequency electronic components used for circuits processing high frequency signals, those formed through the use of layered substrates have been widely used. A layered substrate incorporates dielectric layers and conductor layers alternately stacked. Inside the layered substrate a circuit processing high frequency signals formed by using part of the conductor layers is formed. Typically, a plurality of terminals are provided at the bottom of a high frequency electronic component formed through the use of a layered substrate. These terminals include: a plurality of functional terminals for inputting and outputting signals relating to functions of the circuit formed inside the layered substrate; and a plurality of ground terminals connected to the ground. The high frequency electronic component is mounted on a mounting board. In this case, the above-mentioned plurality of terminals are bonded to a conductor layer formed on the mounting board through the use of a conductive bonding agent, for example.

As disclosed in Japanese Published Patent Application 2001-285112 and Japanese Published Patent Application 2003-124058, the above-mentioned plurality of terminals are arranged near the periphery of the bottom of the high frequency electronic component in many cases. At the bottom of the high frequency electronic component, a conductor section for grounding is provided in some cases, the conductor section being located in a region surrounded by the above-mentioned plurality of terminals and being connected to the ground. Typically, a conductor layer for grounding that is connected to the ground is provided inside the layered substrate. The ground terminals and the conductor section for grounding are electrically connected to the conductor layer for grounding via through holes provided inside the layered substrate and conductor sections provided on side surfaces of the layered substrate.

Japanese Published Patent Application 2001-244207 discloses a high frequency circuit device comprising: a single circuit board; a plurality of high frequency circuits formed on the circuit board; and ground electrodes provided on the rear surface of the circuit board for the respective high frequency circuits, wherein the ground electrodes for the respective high frequency circuits are isolated from one another with spacing.

As a reduction in size of a high frequency electronic component is promoted, the sizes of terminals are reduced, too. As a result, there arises a problem that the strength of bonding between the high frequency electronic component and a mounting board is decreased. In addition, if the sizes of the terminals are reduced, electrical connection between the ground terminals and the conductor layer for grounding inside the layered substrate is weakened, so that there arise problems such as nonuniformity of electrical potential of conductor portions including the ground terminals and the conductor layer for grounding that should be at the ground potential.

OBJECT AND SUMMARY OF THE INVENTION

It is an object of the invention to provide a high frequency electronic component incorporating a layered substrate and a plurality of terminals disposed on a bottom surface of the layered substrate, the high frequency electronic component being capable of enhancing the strength of bonding between the high frequency electronic component and a mounting board and capable of improving the uniformity of electrical potential of conductor portions to be at the ground potential.

A high frequency electronic component of the invention comprises: a layered substrate including dielectric layers and conductor layers alternately stacked; a circuit for processing high frequency signals that is formed through the use of part of the conductor layers and located inside the layered substrate; a plurality of functional terminals for inputting and outputting signals relating to functions of the circuit; and a plurality of ground terminals connected to a ground.

In the high frequency electronic component of the invention, the conductor layers include a conductor layer for grounding located inside the layered substrate and connected to the ground. At least part of the functional terminals and at least part of the ground terminals are located on the bottom surface of the layered substrate. The high frequency electronic component of the invention further comprises a conductor section for grounding that is located on the bottom surface of the layered substrate and connected to the ground. The conductor section for grounding includes: a center portion located in a region surrounded by the functional terminals and the ground terminals on the bottom surface of the layered substrate; and coupling portions for coupling the center portion to the ground terminals, and the conductor section for grounding is connected to the conductor layer for grounding via at least one through hole formed inside the layered substrate.

In the high frequency electronic component of the invention, the ground terminals are coupled to the conductor section for grounding on the bottom surface of the layered substrate. As a result, according to the invention, it is possible to make the area of the bottom surface of the layered substrate occupied by a portion bonded to a conductor layer of a mounting board greater, compared with a case in which the ground terminals are separated from the conductor section for grounding on the bottom surface of the layered substrate. Furthermore, in the invention, the conductor section for grounding is connected to the conductor layer for grounding via at least one through hole formed inside the layered substrate. As a result, according to the invention, the uniformity of electrical potential of conductor portions to be at the ground potential is improved, the conductor portions including the ground terminals, the conductor section for grounding, and the conductor layer for grounding.

In the high frequency electronic component of the invention, the center portion may be rectangle-shaped, the functional terminals and the ground terminals may be arranged to surround the center portion, and the coupling portions may extend radially from the center portion toward the ground terminals.

In the high frequency electronic component of the invention, the center portion and the coupling portions may be respectively connected to the conductor layer for grounding via separate through holes formed inside the layered substrate.

In the high frequency electronic component of the invention, the ground terminals, the center portion and the coupling portions may be respectively connected to the conductor layer for grounding via separate through holes formed inside the layered substrate.

In the high frequency electronic component of the invention, the ground terminals may be each located between respective adjacent ones of the functional terminals.

In the high frequency electronic component of the invention, an area of the conductor section for grounding that occupies the bottom surface of the layered substrate may be greater than an area of each of the ground terminals that occupies the bottom surface of the layered substrate.

In the high frequency electronic component of the invention, the bottom surface of the layered substrate may be rectangle-shaped, and at least one of the ground terminals may be disposed near each of four sides of the bottom surface.

The high frequency electronic component of the invention may further comprise an insulating layer that is located on the bottom surface of the layered substrate and that covers the coupling portions so that surfaces of the ground terminals are separated from a surface of the center portion.

According to the high frequency electronic component of the invention, since the ground terminals are coupled to the conductor section for grounding on the bottom surface of the layered substrate, it is possible to make the area of the bottom surface of the layered substrate occupied by a portion bonded to a conductor layer of a mounting board greater, compared with a case in which the ground terminals are separated from the conductor section for grounding on the bottom surface of the layered substrate. As a result, according to the invention, it is possible to enhance the strength of bonding between the high frequency electronic component and the mounting board. Furthermore, in the invention, the conductor section for grounding is connected to the conductor layer for grounding via at least one through hole formed inside the layered substrate. As a result, the uniformity of electrical potential of conductor portions to be at the ground potential is improved, the conductor portions including the ground terminals, the conductor section for grounding, and the conductor layer for grounding.

In the high frequency electronic component of the invention, the center portion and the coupling portions may be respectively connected to the conductor layer for grounding via separate through holes formed inside the layered substrate. In this case, it is possible to further improve the uniformity of electrical potential of the conductor portions to be at the ground potential.

In the high frequency electronic component of the invention, the ground terminals, the center portion and the coupling portions may be respectively connected to the conductor layer for grounding via separate through holes formed inside the layered substrate. In this case, it is possible to further improve the uniformity of electrical potential of the conductor portions to be at the ground potential.

In the high frequency electronic component of the invention, the ground terminals may be each located between respective adjacent ones of the functional terminals. In this case, it is possible to prevent electromagnetic interference between respective adjacent ones of the functional terminals.

In the high frequency electronic component of the invention, an area of the conductor section for grounding that occupies the bottom surface of the layered substrate may be greater than an area of each of the ground terminals that occupies the bottom surface of the layered substrate. In this case, it is possible to further enhance the strength of bonding between the high frequency electronic component and the mounting board.

In the high frequency electronic component of the invention, the bottom surface of the layered substrate may be rectangle-shaped, and at least one of the ground terminals may be disposed near each of four sides of the bottom surface. In this case, it is possible to further enhance the strength of bonding between the high frequency electronic component and the mounting board.

The high frequency electronic component of the invention may further comprise the insulating layer that is located on the bottom surface of the layered substrate and that covers the coupling portions so that the surfaces of the ground terminals are separated from the surface of the center portion. In this case, it is possible to prevent defects which may occur in a case where the coupling portions that are part of the conductor portions are exposed.

Other and further objects, features and advantages of the invention will appear more fully from the following description.

DESCRIPTION OF PREFERRED EMBODIMENTS

First Embodiment

Preferred embodiments of the invention will now be described with reference to the accompanying drawings. A high frequency electronic component of a first embodiment of the invention will be first described. The high frequency electronic component of the embodiment is used in a communications apparatus for a wireless LAN and designed to process reception signals and transmission signals in a first frequency band and reception signals and transmission signals in a second frequency band that is higher than the first frequency band. The first frequency band is a 2.4 GHz band that is used for the IEEE802.11b and the IEEE802.11g, for example. The second frequency band is a 5 GHz band that is used for the IEEE802.11a, for example. The high frequency electronic component of the embodiment is provided for a diversity.

Figure 3:
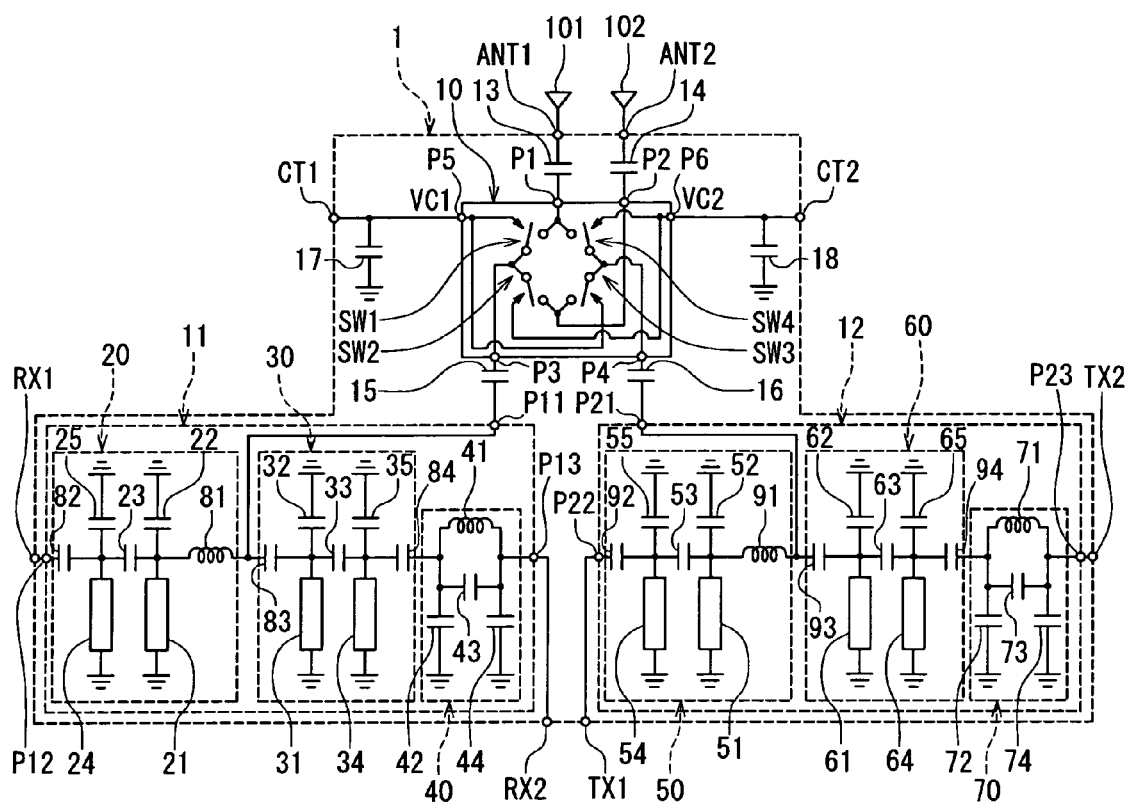
FIG. 3 is a schematic diagram illustrating the high frequency electronic component of the first embodiment of the invention.

FIG. 3 is a schematic diagram illustrating the circuit configuration of the high frequency electronic component of the embodiment. The high frequency electronic component 1 of the embodiment comprises: first and second antenna terminals ANT1 and ANT2 connected to different antennas 101 and 102, respectively; a first reception signal terminal RX1 for outputting a reception signal in the first frequency band (the reception signal is hereinafter called a first reception signal); a second reception signal terminal RX2 for outputting a reception signal in the second frequency band (the reception signal is hereinafter called a second reception signal); a first transmission signal terminal TX1 for receiving a transmission signal in the first frequency band (the transmission signal is hereinafter called a first transmission signal); a second transmission signal terminal TX2 for receiving a transmission signal in the second frequency band (the transmission signal is hereinafter called a second transmission signal); a first control terminal CT1 for receiving a first control signal VC1; and a second control terminal CT2 for receiving a second control signal VC2. The reception signal terminals RX1 and RX2, the transmission signal terminals TX1 and TX2, and the control terminals CT1 and CT2 are connected to an external circuit.

The high frequency electronic component 1 further comprises: a switch circuit 10 connected to the antenna terminals ANT1 and ANT2; a first diplexer 11 connected to the reception signal terminals RX1 and RX2 and the switch circuit 10; and a second diplexer 12 connected to the transmission signal terminals TX1 and TX2 and the switch circuit 10.

The high frequency electronic component 1 further comprises capacitors 13 to 18. The capacitor 13 is inserted in series to a signal path between the switch circuit 10 and the antenna terminal ANT1. The capacitor 14 is inserted in series to a signal path between the switch circuit 10 and the antenna terminal ANT2. The capacitor 15 is inserted in series to a signal path between the switch circuit 10 and the diplexer 11. The capacitor 16 is inserted in series to a signal path between the switch circuit 10 and the diplexer 12. Each of the capacitors 13, 14, 15 and 16 is provided for blocking passing of a direct current resulting from the control signals VC1 and VC2. The capacitor 17 has an end connected to the control terminal CT1 and the other end grounded. The capacitor 18 has an end connected to the control terminal CT2 and the other end grounded.

The switch circuit 10 incorporates six ports P1 to P6. The port P1 is connected to the antenna terminal ANT1 through the capacitor 13. The port P2 is connected to the antenna terminal ANT2 through the capacitor 14. The port P3 is connected to the diplexer 11 through the capacitor 15. The port P4 is connected to the diplexer 12 through the capacitor 16. The ports P5 and P6 are connected to the control terminals CT1 and CT2, respectively.

The switch circuit 10 further incorporates four switches SW1 to SW4 for each of which a conducting state or a non-conducting state is chosen. Each of the switches SW1 to SW4 is formed using a field-effect transistor made of a GaAs compound semiconductor, for example. The switch SW1 has an end connected to the port P1 and the other end connected to the port P3. The switch SW2 has an end connected to the port P2 and the other end connected to the port P3. The switch SW3 has an end connected to the port P2 and the other end connected to the port P4. The switch SW4 has an end connected to the port P1 and the other end connected to the port P4.

The switches SW1 and SW3 are conducting when the control signal VC1 inputted to the port P5 is high. The switches SW1 and SW3 are nonconducting when the control signal VC1 is low. The switches SW2 and SW4 are conducting when the control signal VC2 inputted to the port P6 is high. The switches SW2 and SW4 are nonconducting when the control signal VC2 is low. Consequently, when the control signal VC1 is high and the control signal VC2 is low, the ports P1 and P3 are connected to each other while the ports P2 and P4 are connected to each other. At this time, the diplexer 11 is connected to the antenna terminal ANT1 while the diplexer 12 is connected to the antenna terminal ANT2. On the other hand, when the control signal VC1 is low and the control signal VC2 is high, the ports P1 and P4 are connected to each other while the ports P2 and P3 are connected to each other. At this time, the diplexer 11 is connected to the antenna terminal ANT2 while the diplexer 12 is connected to the antenna terminal ANT1. In such a manner, the switch circuit 10 connects one of the diplexers 11 and 12 to one of the antenna terminals ANT1 and ANT2.

The diplexer 11 has three ports P11 to P13. The port P11 is connected to the port P3 of the switch circuit 10 through the capacitor 15. The port P12 is connected to the reception signal terminal RX1. The port P13 is connected to the reception signal terminal RX2.

The diplexer 11 further incorporates: two bands-pass filters (which may be hereinafter referred to as BPFs) 20 and 30; a low-pass filter (which may be hereinafter referred to as an LPF) 40. The BPF 20 has an end connected to the port P11 and the other end connected to the port P12. The BPF 30 has an end connected to the port P11 and the other end connected to an end of the LPF 40. The other end of the LPF 40 is connected to the port P13.

The BPF 20 incorporates: an inductor 81; transmission lines 21 and 24 having an inductance; and capacitors 22, 23, 25 and 82. Each of the transmission line 21 and the capacitors 22 and 23 has an end connected to the port P11 through the inductor 81. Each of the transmission line 21 and the capacitor 22 has the other end grounded. Each of the transmission line 24 and the capacitor 25 has an end connected to the other end of the capacitor 23 and connected to the port P12 through the capacitor 82. Each of the transmission line 24 and the capacitor 25 has the other end grounded. The transmission line 21 and the capacitor 22 make up a parallel resonant circuit. The transmission line 24 and the capacitor 25 make up another parallel resonant circuit. The BPF 20 is thus formed using the two parallel resonant circuits.

The BPF 30 incorporates: transmission lines 31 and 34 having an inductance; and capacitors 32, 33, 35, 83 and 84. Each of the transmission line 31 and the capacitors 32 and 33 has an end connected to the port P11 through the capacitor 83. Each of the transmission line 31 and the capacitor 32 has the other end grounded. Each of the transmission line 34 and the capacitor 35 has an end connected to the other end of the capacitor 33 and connected to the LPF 40 through the capacitor 84. Each of the transmission line 34 and the capacitor 35 has the other end grounded. The transmission line 31 and the capacitor 32 make up a parallel resonant circuit. The transmission line 34 and the capacitor 35 make up another parallel resonant circuit. The BPF 30 is thus formed using the two parallel resonant circuits.

The LPF 40 incorporates an inductor 41 and capacitors 42, 43 and 44. Each of the inductor 41 and the capacitors 42 and 43 has an end connected to the BPF 30. Each of the inductor 41 and the capacitor 43 has the other end connected to the port P13. The capacitor 42 has the other end grounded. The capacitor 44 has an end connected to the port P13 and the other end grounded.

The BPF 20 allows signals of frequencies within the first frequency band to pass and intercepts signals of frequencies outside the first frequency band. As a result, the BPF 20 allows passage of the first reception signal that has been inputted to the antenna terminal ANT1 or ANT2 and passed through the switch circuit 10, and sends it to the reception signal terminal RX1. The inductor 81 and the capacitor 82 improve a passing characteristic of the path of the first reception signal including the BPF 20.

The BPF 30 allows signals of frequencies within the second frequency band to pass and intercepts signals of frequencies outside the second frequency band. The LPF 40 allows signals of frequencies within the second frequency band and signals of frequencies lower than the second frequency band to pass, and intercepts signals of frequencies higher than the second frequency band. As a result, the BPF 30 and the LPF 40 allow passage of the second reception signal that has been inputted to the antenna terminal ANT1 or ANT2 and passed through the switch circuit 10, and send it to the reception signal terminal RX2. The capacitors 83 and 84 improve a passing characteristic of the path of the second reception signal including the BPF 30 and the LPF 40.

The diplexer 12 has three ports P21 to P23. The port P21 is connected to the port P4 of the switch circuit 10 through the capacitor 16. The port P22 is connected to the transmission signal terminal TX1. The port P23 is connected to the transmission signal terminal TX2.

The diplexer 12 further incorporates two BPFs 50 and 60 and an LPF 70. The BPF 50 has an end connected to the port P21 and the other end connected to the port P22. The BPF 60 has an end connected to the port P21 and the other end connected to an end of the LPF 70. The other end of the LPF 70 is connected to the port P23.

The BPF 50 incorporates an inductor 91, transmission lines 51 and 54 having an inductance, and capacitors 52, 53, 55 and 92. Each of the transmission line 51 and the capacitors 52 and 53 has an end connected to the port P21 through the inductor 91. Each of the transmission line 51 and the capacitor 52 has the other end grounded. Each of the transmission line 54 and the capacitor 55 has an end connected to the other end of the capacitor 53 and connected to the port P22 through the capacitor 92. Each of the transmission line 54 and the capacitor 55 has the other end grounded. The transmission line 51 and the capacitor 52 make up a parallel resonant circuit. The transmission line 54 and the capacitor 55 make up another parallel resonant circuit. The BPF 50 is thus formed using the two parallel resonant circuits.

The BPF 60 incorporates: transmission lines 61 and 64 having an inductance; and capacitors 62, 63, 65, 93 and 94. Each of the transmission line 61 and the capacitors 62 and 63 has an end connected to the port P21 through the capacitor 93. Each of the transmission line 61 and the capacitor 62 has the other end grounded. Each of the transmission line 64 and the capacitor 65 has an end connected to the other end of the capacitor 63 and connected to the LPF 70 through the capacitor 94. Each of the transmission line 64 and the capacitor 65 has the other end grounded. The transmission line 61 and the capacitor 62 make up a parallel resonant circuit. The transmission line 64 and the capacitor 65 make up another parallel resonant circuit. The BPF 60 is thus formed using the two parallel resonant circuits.

The LPF 70 incorporates an inductor 71, and capacitors 72, 73 and 74. Each of the inductor 71 and the capacitors 72 and 73 has an end connected to the BPF 60. Each of the inductor 71 and the capacitor 73 has the other end connected to the port P23. The capacitor 72 has the other end grounded. The capacitor 74 has an end connected to the port P23 and the other end grounded.

The BPF 50 allows signals of frequencies within the first frequency band to pass and intercepts signals of frequencies outside the first frequency band. As a result, the BPF 50 allows the first transmission signal inputted to the transmission signal terminal TX1 to pass and sends it to the switch circuit 10. The inductor 91 and the capacitor 92 improve a passing characteristic of the path of the first transmission signal including the BPF 50.

The BPF 60 allows signals of frequencies within the second frequency band to pass and intercepts signals of frequencies outside the second frequency band. The LPF 70 allows signals of frequencies within the second frequency band and signals of frequencies lower than the second frequency band to pass, and intercepts signals of frequencies higher than the second frequency band. As a result, the BPF 60 and the LPF 70 allow the second transmission signal inputted to the transmission signal terminal TX2 to pass and sends it to the switch circuit 10. The capacitors 93 and 94 improve a passing characteristic of the path of the second transmission signal including the BPF 60 and the LPF 70.

In the high frequency electronic component 1, the first reception signal inputted to the antenna terminal ANT1 or ANT2 passes through the switch circuit 10 and the BPF 20 and is sent to the reception signal terminal RX1. The second reception signal inputted to the antenna terminal ANT1 or ANT2 passes through the switch circuit 10, the BPF 30 and the LPF 40, and is sent to the reception signal terminal RX2. The first transmission signal inputted to the transmission signal terminal TX1 passes through the BPF 50 and the switch circuit 10 and is sent to the antenna terminal ANT1 or ANT2. The second transmission signal inputted to the transmission signal terminal TX2 passes through the LPF 70, the BPF 60 and the switch circuit 10 and is sent to the antenna terminal ANT1 or ANT2.

Figure 1:
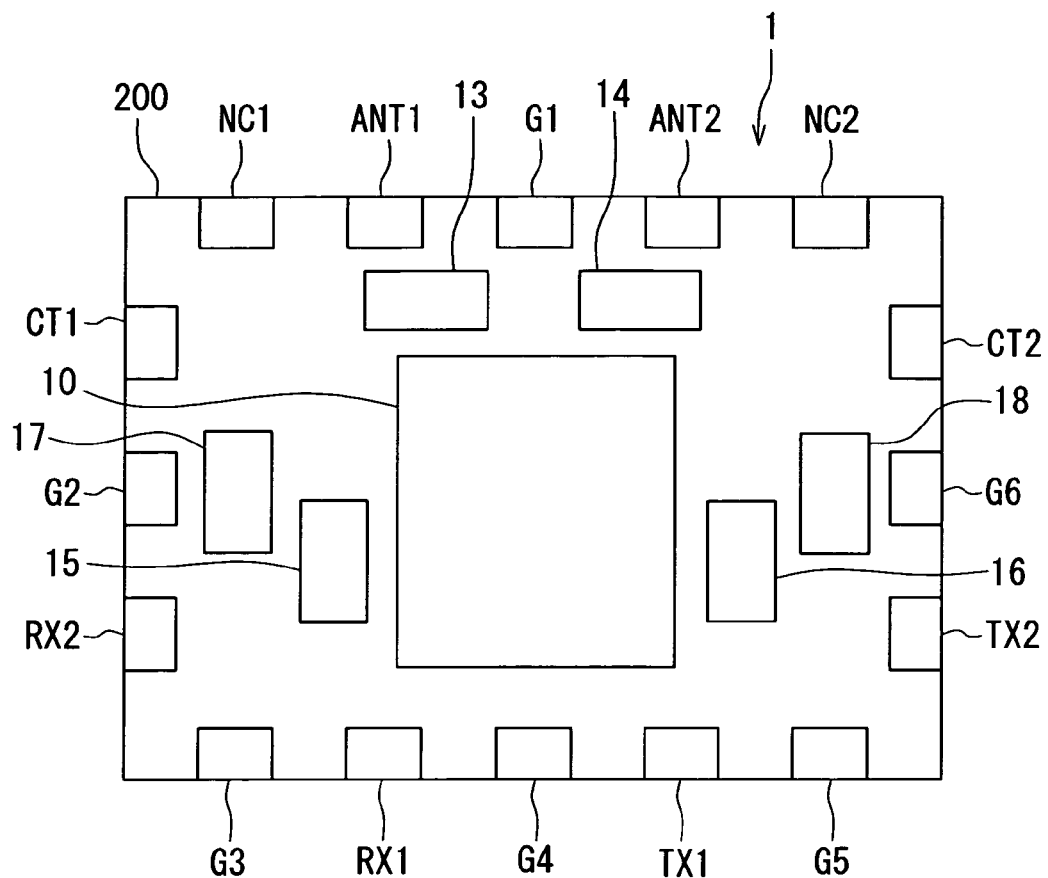
FIG. 1 is a top view of a high frequency electronic component of a first embodiment of the invention.
Figure 2:
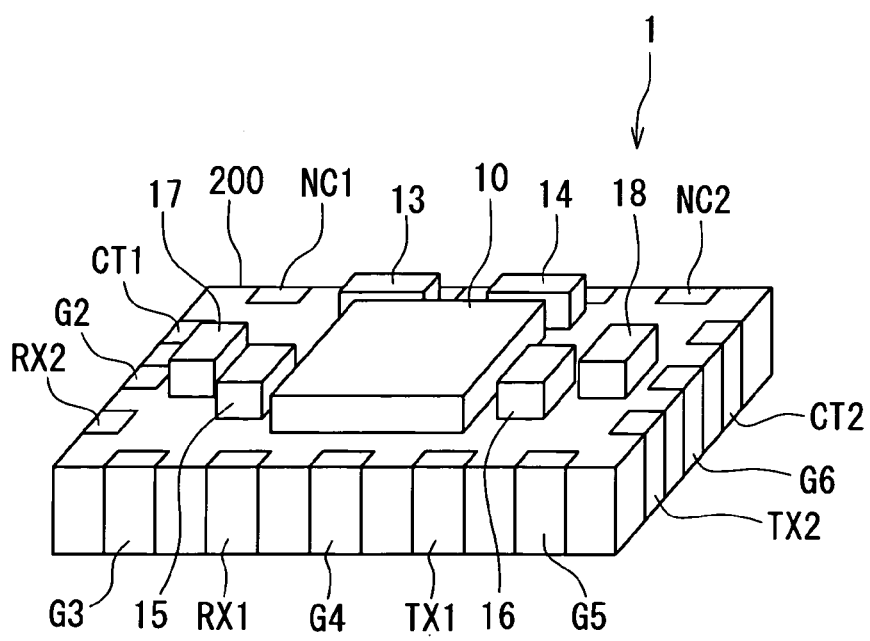
FIG. 2 is a perspective view of an appearance of the high frequency electronic component of the first embodiment of the invention.

Reference is now made to FIG. 1 and FIG. 2 to describe the structure of the high frequency electronic component 1. FIG. 1 is a top view of the high frequency electronic component 1. FIG. 2 is a perspective view illustrating an appearance of the high frequency electronic component 1. As shown in FIG. 1 and FIG. 2, the high frequency electronic component 1 comprises a layered substrate 200 for integrating the previously mentioned components of the high frequency electronic component 1. The layered substrate 200 incorporates dielectric layers and conductor layers that are alternately stacked. The circuit for processing high frequency signals in the high frequency electronic component 1 is formed using the conductor layers located inside the layered substrate 200 or on the surface of the layered substrate 200, and elements mounted on the top surface of the layered substrate 200. Here is an example in which the switch circuit 10 and the capacitors 13 to 18 of FIG. 3 are mounted on the layered substrate 200. The switch circuit 10 has the form of a single component. The layered substrate 200 is a multilayer substrate of low-temperature co-fired ceramic, for example.

The above-mentioned terminals ANT1, ANT2, RX1, RX2, TX1, TX2, CT1 and CT2, six ground terminals G1 to G6, and terminals NC1 and NC2 are provided to extend from the top surface to the bottom surface through the side surfaces of the layered substrate 200. The ground terminals G1 to G6 are connected to the ground. The terminals NC1 and NC2 are ones which are not to be connected to external circuits. As shown in FIG. 1, the plane geometry of the layered substrate 200 is a rectangle. Of this rectangle two longer sides are called a first side (the upper side of FIG. 1) and a second side (the lower side of FIG. 1), and two shorter sides are called a third side (the left-hand side of FIG. 1) and a fourth side (the right-hand side of FIG. 1).

On the first side the terminal G1 is placed in the middle and the terminals ANT1 and ANT2 are placed on both sides of the terminal G1. On the first side the terminal NC1 is placed on a side of the terminal ANT1 opposite to the terminal G1, and the terminal NC2 is placed on a side of the terminal ANT2 opposite to the terminal G1. On the second side the terminal G4 is placed in the middle and the terminals RX1 and TX1 are placed on both sides of the terminal G4. On the second side the terminal G3 is placed on a side of the terminal RX1 opposite to the terminal G4, and the terminal G5 is placed on a side of the TX1 opposite to the terminal G4. On the third side the terminal G2 is placed in the middle, the terminal CT1 is placed between the terminal G2 and the first side, and the terminal RX2 is placed between the terminal G2 and the second side. On the fourth side the terminal G6 is placed in the middle, the terminal CT2 is placed between the terminal G6 and the first side, and the terminal TX2 is placed between the terminal G6 and the second side.

The diplexers 11 and 12 are provided inside the layered substrate 200. The diplexer 11 is a circuit that performs processing of separating the first reception signal and the second reception signal as high frequency signals from each other. The diplexer 12 is a circuit that performs processing of separating the first transmission signal and the second transmission signal as high frequency signals from each other.

Figure 4:
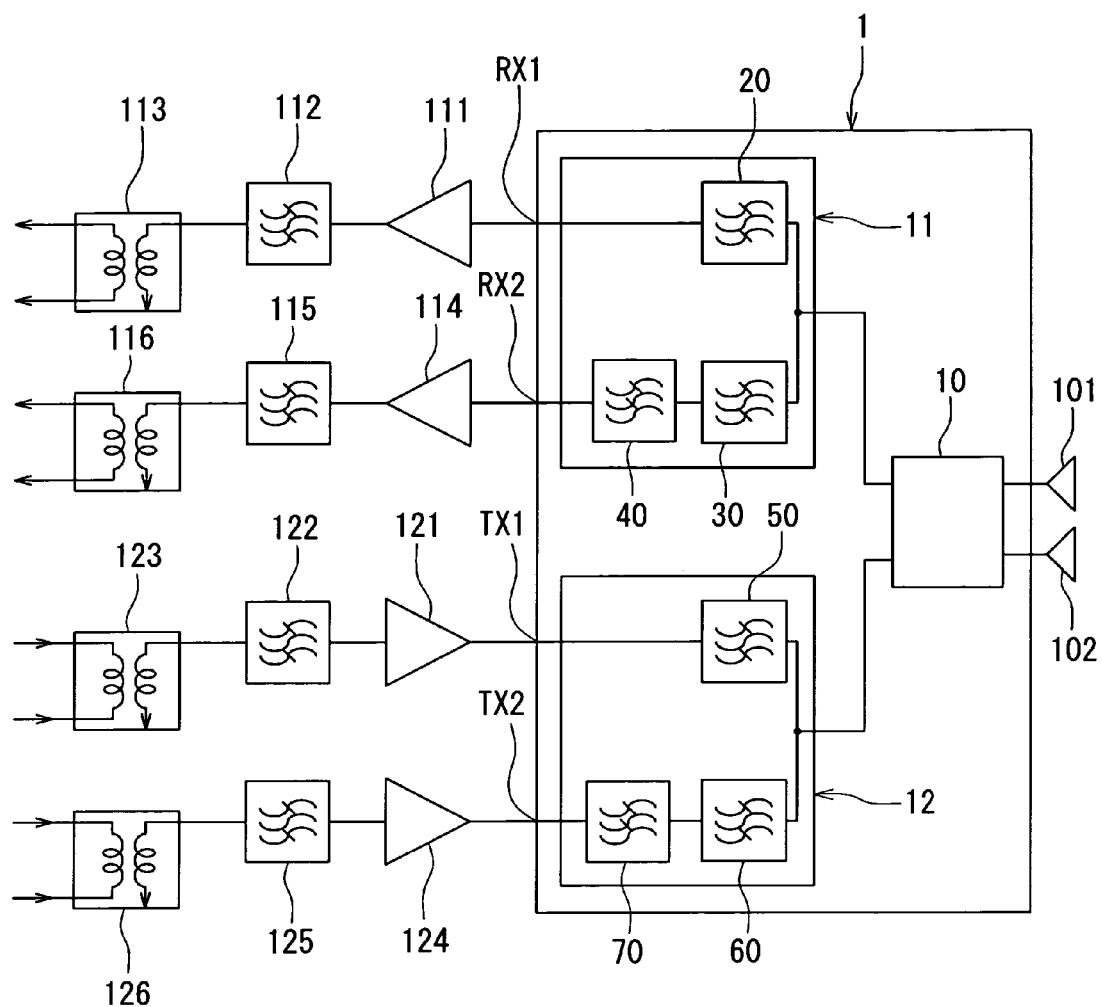
FIG. 4 is a block diagram illustrating an example of the configuration of a high frequency circuit section of a communications apparatus for a wireless LAN in which the high frequency electronic component of the first embodiment of the invention is used.

Reference is now made to FIG. 4 to describe an example of configuration of a high frequency circuit section of a communications apparatus for a wireless LAN in which the high frequency electronic component 1 of the embodiment is used. The high frequency circuit section of FIG. 4 comprises the high frequency electronic component 1, and the two antennas 101 and 102 connected to the high frequency electronic component 1.

The high frequency circuit section further comprises: a low-noise amplifier 111 having an input connected to the reception signal terminal RX1 of the high frequency electronic component 1; a BPF 112 having an end connected to an output of the low-noise amplifier 111; and a balun 113 having an unbalanced terminal connected to the other end of the BPF 112. The first reception signal outputted from the reception signal terminal RX1 is amplified at the low-noise amplifier 111, then passes through the BPF 112, is converted to a balanced signal at the balun 113, and is outputted from two balanced terminals of the balun 113.

The high frequency circuit section further comprises: a low-noise amplifier 114 having an input connected to the reception signal terminal RX2 of the high frequency electronic component 1; a BPF 115 having an end connected to an output of the low-noise amplifier 114; and a balun 116 having an unbalanced terminal connected to the other end of the BPF 115. The second reception signal outputted from the reception signal terminal RX2 is amplified at the low-noise amplifier 114, then passes through the BPF 115, is converted to a balanced signal at the balun 116, and is outputted from two balanced terminals of the balun 116.

The high frequency circuit section further comprises: a power amplifier 121 having an output connected to the transmission signal terminal TX1 of the high frequency electronic component 1; a BPF 122 having an end connected to an input of the power amplifier 121; and a balun 123 having an unbalanced terminal connected to the other end of the BPF 122. A balanced signal corresponding to the first transmission signal is inputted to two balanced terminals of the balun 123, is converted to an unbalanced signal at the balun 123, passes through the BPF 122, is amplified at the power amplifier 121, and then given to the transmission signal terminal TX1 as the first transmission signal.

The high frequency circuit section further comprises: a power amplifier 124 having an output connected to the transmission signal terminal TX2 of the high frequency electronic component 1; a BPF 125 having an end connected to an input of the power amplifier 124; and a balun 126 having an unbalanced terminal connected to the other end of the BPF 125. A balanced signal corresponding to the second transmission signal is inputted to two balanced terminals of the balun 126, is converted to an unbalanced signal at the balun 126, passes through the BPF 125, is amplified at the power amplifier 124, and then given to the transmission signal terminal TX2 as the second transmission signal.

The configuration of the high frequency circuit section is not limited to the one illustrated in FIG. 4 but a variety of modifications are possible. For example, the high frequency circuit section may be one that does not incorporate the baluns 113 and 116 and that allows a signal having passed through the BPFs 112 and 115 to be outputted as an unbalanced signal as it is. The positional relationship between the low-noise amplifier 111 and the BPF 112 and the positional relationship between the low-noise amplifier 114 and the BPF 115 may be the reverse of the ones shown in FIG. 4. Furthermore, low-pass filters or high-pass filters may be provided in place of the BPFs 112, 115, 122 and 125.

Figure 25:
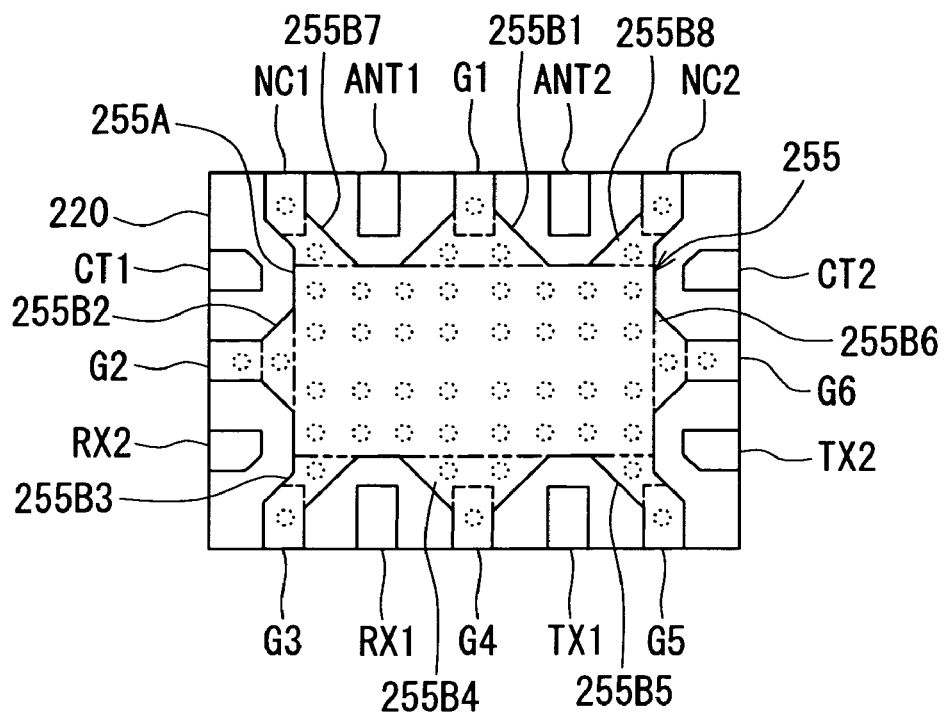
FIG. 25 is a top view illustrating the twentieth dielectric layer and conductor layers therebelow of the layered substrate of FIG. 1.
Figure 26:
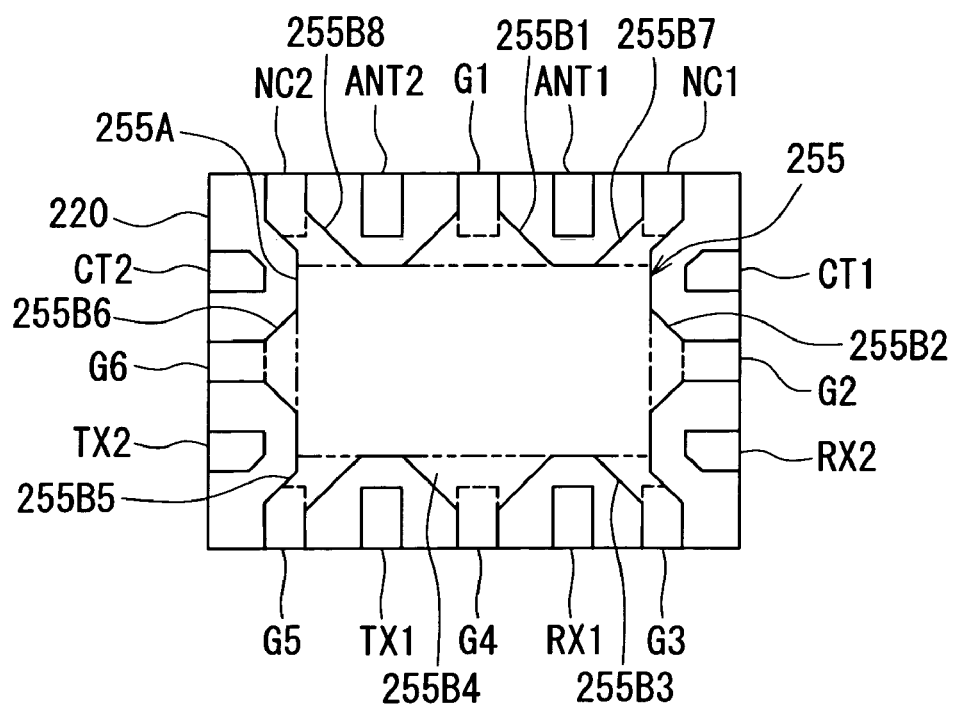
FIG. 26 is a bottom view of the layered substrate of FIG. 1.

Reference is now made to FIG. 5 to FIG. 26 to describe an example of configuration of the layered substrate 200. FIG. 5 to FIG. 24 illustrate top surfaces of first to twentieth (the lowest) dielectric layers from the top. FIG. 25 illustrates the twentieth dielectric layer from the top and conductor layers therebelow seen from above. FIG. 26 is a bottom view of the layered substrate 200. Small circles of FIG. 5 to FIG. 24 indicate through holes.

Figure 5:
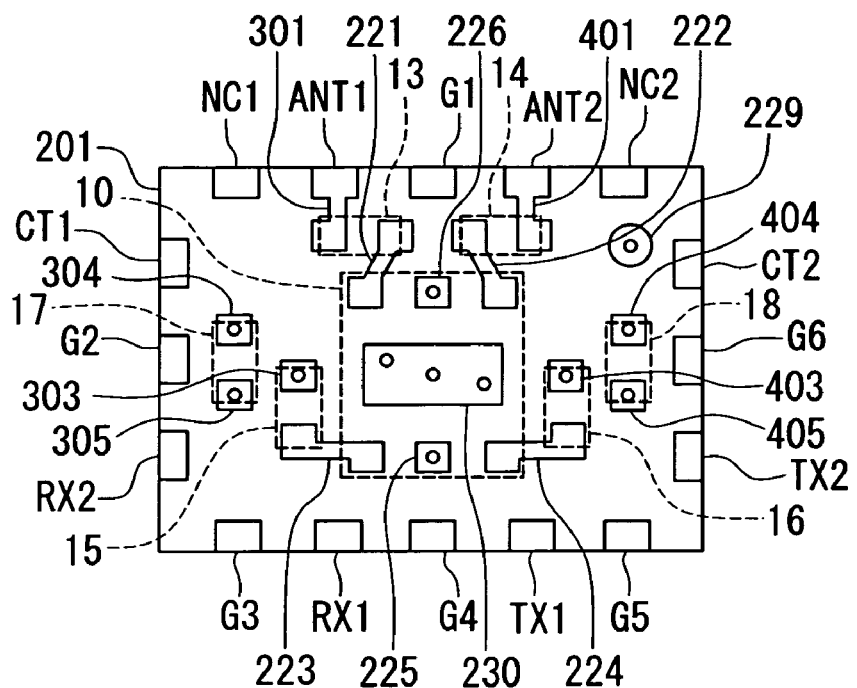
FIG. 5 is a top view illustrating a top surface of a first dielectric layer of the layered substrate of FIG. 1.

On the top surface of the first dielectric layer 201 of FIG. 5, a conductor layer 301 connected to the terminal ANT1, a conductor layer 401 connected to the terminal ANT2, and conductor layers which make up the terminals RX1, RX2, TX1, TX2, CT1, CT2, G1 to G6, NC1, and NC2 are formed. Furthermore, on the top surface of the dielectric layer 201, six conductor layers 221 to 226 to which the ports P1 to P6 of the switch circuit 10 are connected and a conductor layer 230 connected to the ground are formed. On the top surface of the dielectric layer 201, conductor layers 229, 303, 304, 305, 403, 404 and 405 are further formed. The conductor layer 229 is used for alignment of the high frequency electronic component 1.

The capacitor 13 has an end connected to the conductor layer 221 and the other end connected to the conductor layer 301. The capacitor 14 has an end connected to the conductor layer 222 and the other end connected to the conductor layer 401. The capacitor 15 has an end connected to the conductor layer 223 and the other end connected to the conductor layer 303. The capacitor 16 has an end connected to the conductor layer 224 and the other end connected to the conductor layer 403. The capacitor 17 has an end connected to the conductor layer 304 and the other end connected to the conductor layer 305. The capacitor 18 has an end connected to the conductor layer 404 and the other end connected to the conductor layer 405.

Figure 6:
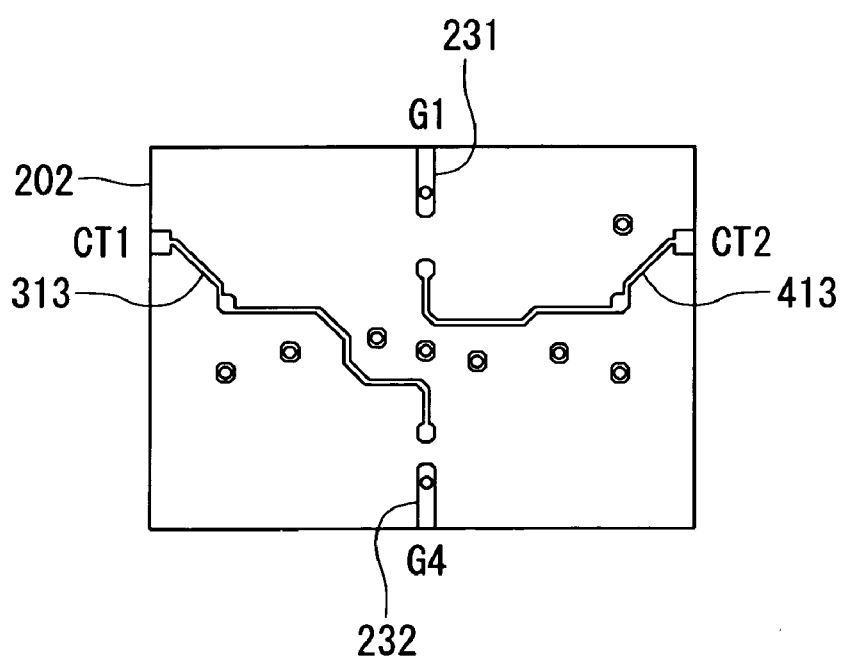
FIG. 6 is a top view illustrating a top surface of a second dielectric layer of the layered substrate of FIG. 1.

On the top surface of the second dielectric layer 202 of FIG. 6, conductor layers 231, 232, 313 and 413 are formed. The conductor layer 231 is connected to the terminal G1. The conductor layer 232 is connected to the terminal G4. The conductor layer 313 is connected to the terminal CT1. The conductor layer 413 is connected to the terminal CT2. The conductor layers 225 and 304 of FIG. 5 are connected to the conductor layer 313 via through holes formed in the dielectric layer 201. The conductor layers 226 and 404 of FIG. 5 are connected to the conductor layer 413 via through holes formed in the dielectric layer 201.

Figure 7:
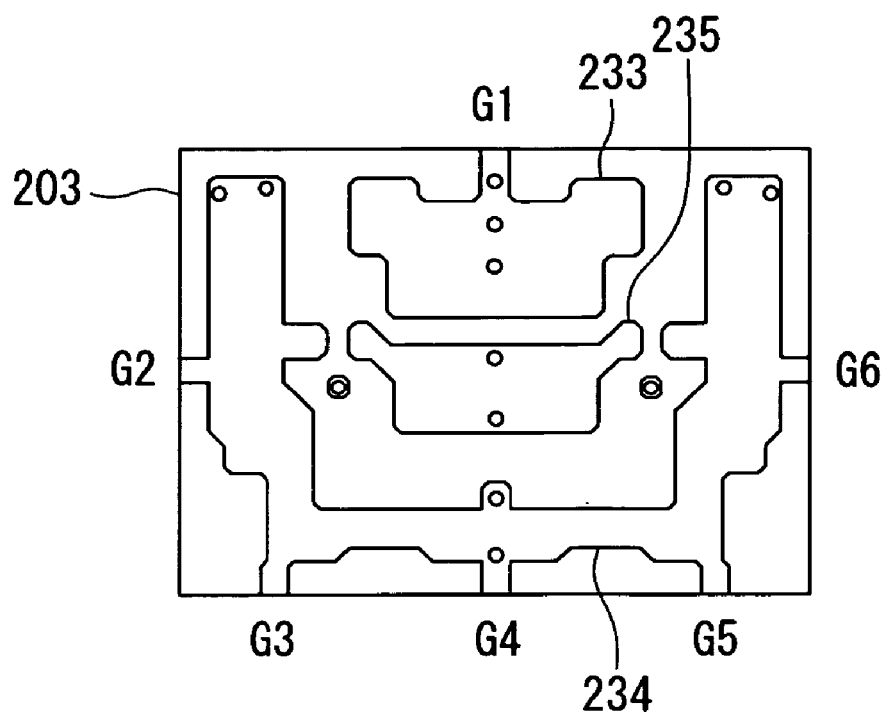
FIG. 7 is a top view illustrating a top surface of a third dielectric layer of the layered substrate of FIG. 1.

On the top surface of the third dielectric layer 203 of FIG. 7, conductor layers 233 to 235 for grounding are formed. The conductor layer 233 is connected to the terminal G1. The conductor layer 231 of FIG. 6 is connected to the conductor layer 233 via a through hole formed in the dielectric layer 202. The conductor layer 234 is connected to the terminals G2 to G6. The conductor layer 232 of FIG. 6 is connected to the conductor layer 234 via a through hole formed in the dielectric layer 202. The conductor layers 229, 305 and 405 of FIG. 5 are connected to the conductor layer 234 via through holes formed in the dielectric layers 201 and 202. The conductor layer 230 of FIG. 5 is connected to the conductor layer 235 via through holes formed in the dielectric layers 201 and 202.

Figure 8:
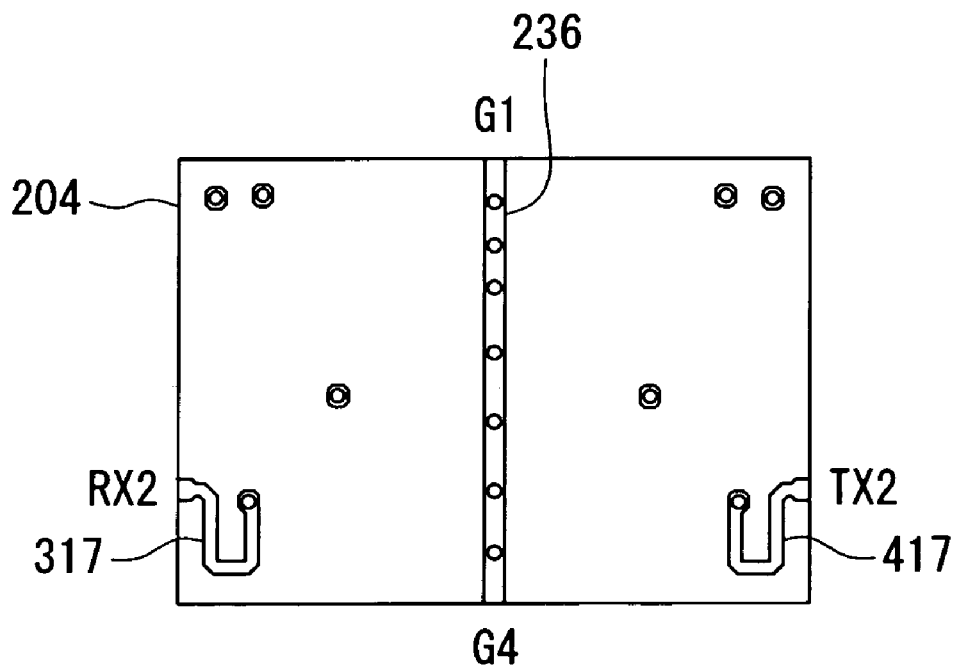
FIG. 8 is a top view illustrating a top surface of a fourth dielectric layer of the layered substrate of FIG. 1.

On the top surface of the fourth dielectric layer 204 of FIG. 8, a conductor layer 236 for grounding and conductor layers 317 and 417 for inductors are formed. The conductor layer 236 is connected to the terminals G1 and G4. The conductor layers 233 to 235 of FIG. 7 are connected to the conductor layer 236 via a plurality of through holes formed in the dielectric layer 203. The conductor layer 317 has an end connected to the terminal RX2. The conductor layer 317 makes up the inductor 41 of FIG. 3. The conductor layer 417 has an end connected to the terminal TX2. The conductor layer 417 makes up the inductor 71 of FIG. 3.

Figure 9:
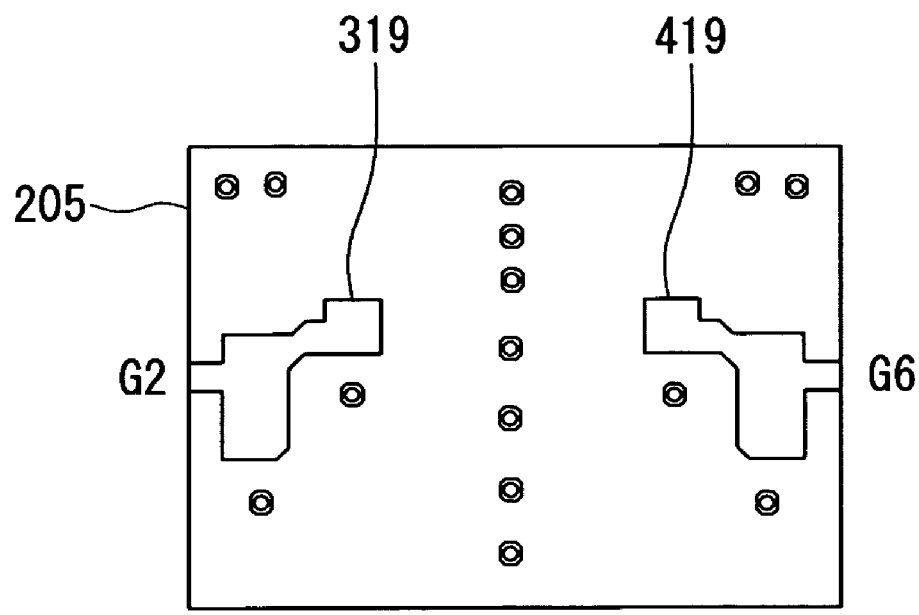
FIG. 9 is a top view illustrating a top surface of a fifth dielectric layer of the layered substrate of FIG. 1.

On the top surface of the fifth dielectric layer 205 of FIG. 9, conductor layers 319 and 419 for capacitors are formed. The conductor layer 319 is connected to the terminal G2. The conductor layer 319 makes up a portion of each of the capacitors 32, 35 and 42 of FIG. 3. The conductor layer 419 is connected to the terminal G6. The conductor layer 419 makes up a portion of each of the capacitors 62, 65 and 72 of FIG. 3.

Figure 10:
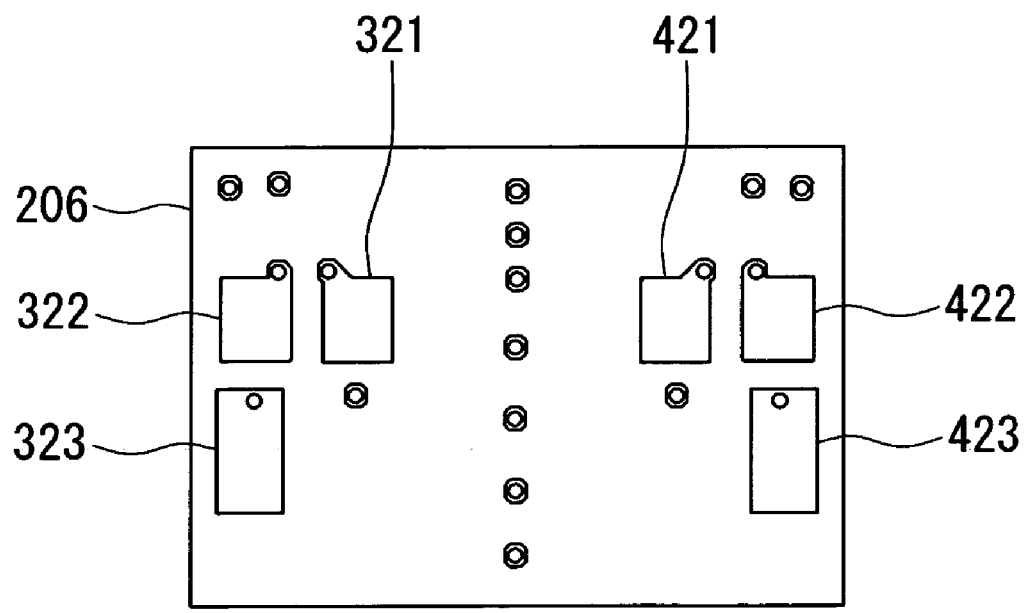
FIG. 10 is a top view illustrating a top surface of a sixth dielectric layer of the layered substrate of FIG. 1.

On the top surface of the sixth dielectric layer 206 of FIG. 10, conductor layers 321, 322, 323, 421, 422 and 423 for capacitors are formed.

The conductor layer 321, together with the conductor layer 319 of FIG. 9, makes up the capacitor 32 of FIG. 3. The conductor layer 321 further makes up a portion of the capacitor 83 of FIG. 3. The conductor layer 322, together with the conductor layer 319 of FIG. 9, makes up the capacitor 35 of FIG. 3. The conductor layer 322 further makes up a portion of the capacitor 84 of FIG. 3. The conductor layer 323, together with the conductor layer 319 of FIG. 9, makes up the capacitor 42 of FIG. 3. The conductor layer 323 further makes up a portion of the capacitor 43 of FIG. 3. The conductor layer 317 of FIG. 8 is connected to the conductor layer 323 via through holes formed in the dielectric layers 204 and 205.

The conductor layer 421, together with the conductor layer 419 of FIG. 9, makes up the capacitor 62 of FIG. 3. The conductor layer 421 further makes up a portion of the capacitor 93 of FIG. 3. The conductor layer 422, together with the conductor layer 419 of FIG. 9, makes up the capacitor 65 of FIG. 3. The conductor layer 422 further makes up a portion of the capacitor 94 of FIG. 3. The conductor layer 423, together with the conductor layer 419 of FIG. 9, makes up the capacitor 72 of FIG. 3. The conductor layer 423 further makes up a portion of the capacitor 73 of FIG. 3. The conductor layer 417 of FIG. 8 is connected to the conductor layer 423 via through holes formed in the dielectric layers 204 and 205.

Figure 11:
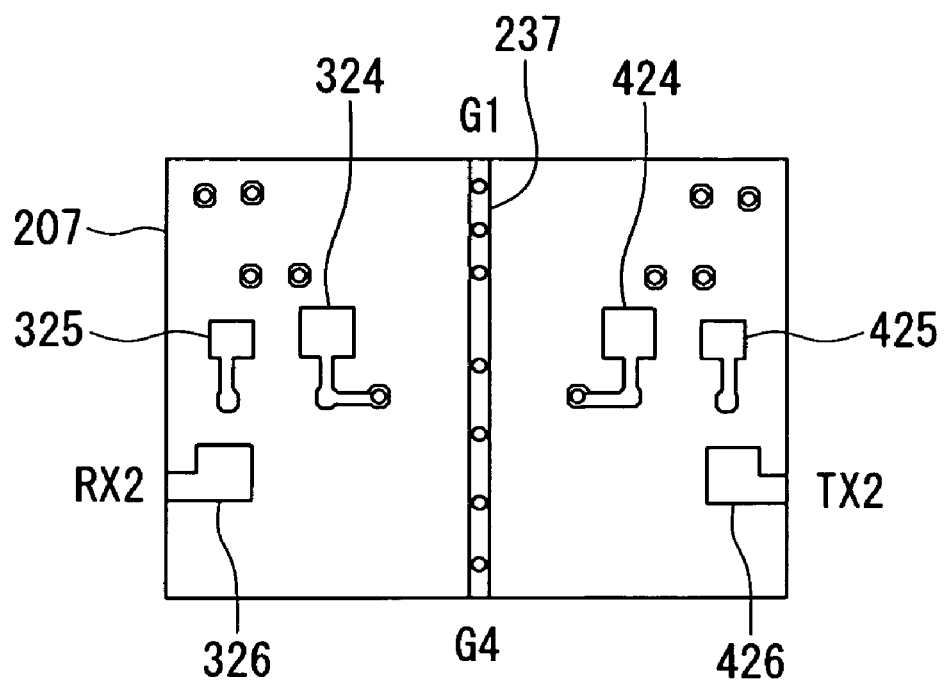
FIG. 11 is a top view illustrating a top surface of a seventh dielectric layer of the layered substrate of FIG. 1.

On the top surface of the seventh dielectric layer 207 of FIG. 11, a conductor layer 237 for grounding and conductor layers 324, 325, 326, 424, 425 and 426 for capacitors are formed. The conductor layer 237 is connected to the terminals G1 and G4. The conductor layer 236 of FIG. 8 is connected to the conductor layer 237 via through holes formed in the dielectric layers 204 to 206.

The conductor layer 303 of FIG. 5 is connected to the conductor layer 324 via through holes formed in the dielectric layers 201 to 206. The conductor layer 323 of FIG. 10 is connected to the conductor layer 325 via a through hole formed in the dielectric layer 206. The conductor layer 326 is connected to the terminal RX2. The conductor layers 324 and 325 make up portions of the capacitors 83 and 84 of FIG. 3, respectively. The conductor layer 326, together with the conductor layer 323 of FIG. 10, makes up the capacitor 43 of FIG. 3.

The conductor layer 403 of FIG. 5 is connected to the conductor layer 424 via through holes formed in the dielectric layers 201 to 206. The 5 conductor layer 423 of FIG. 10 is connected to the conductor layer 425 via a through hole formed in the dielectric layer 206. The conductor layer 426 is connected to the terminal TX2. The conductor layers 424 and 425 make up portions of the capacitors 93 and 94 of FIG. 3, respectively. The conductor layer 426, together with the conductor layer 423 of FIG. 10, makes up the capacitor 73 of FIG. 3.

Figure 12:
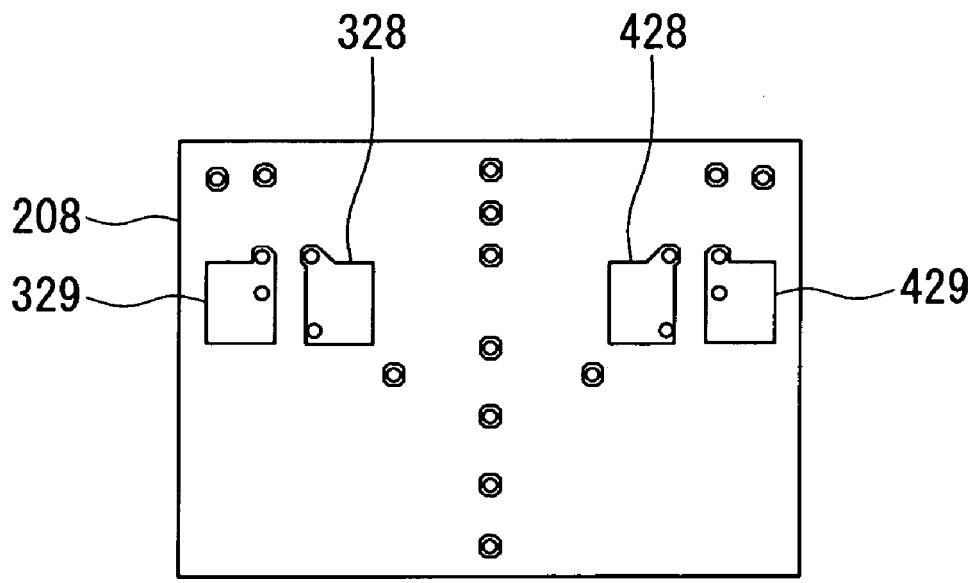
FIG. 12 is a top view illustrating a top surface of an eighth dielectric layer of the layered substrate of FIG. 1.

On the top surface of the eighth dielectric layer 208 of FIG. 12, conductor layers 328, 329, 428 and 429 for capacitors are formed.

The conductor layer 321 of FIG. 10 is connected to the conductor layer 328 via through holes formed in the dielectric layers 206 and 207. The conductor layer 322 of FIG. 10 is connected to the conductor layer 329 via through holes formed in the dielectric layers 206 and 207. The conductor layer 328, together with the conductor layer 324 of FIG. 11, makes up the capacitor 83 of FIG. 3. The conductor layer 328 further makes up a portion of the capacitor 33 of FIG. 3. The conductor layer 329, together with the conductor layer 325 of FIG. 11, makes up the capacitor 84 of FIG. 3. In addition, the conductor layer 329, together with the conductor layer 328, makes up the capacitor 33 of FIG. 3.

The conductor layer 421 of FIG. 10 is connected to the conductor layer 428 via through holes formed in the dielectric layers 206 and 207. The conductor layer 422 of FIG. 10 is connected to the conductor layer 429 via through holes formed in the dielectric layers 206 and 207. The conductor layer 428, together with the conductor layer 424 of FIG. 11, makes up the capacitor 93 of FIG. 3. The conductor layer 428 further makes up a portion of the capacitor 63 of FIG. 3. The conductor layer 429, together with the conductor layer 425 of FIG. 11, makes up the capacitor 94 of FIG. 3. In addition, the conductor layer 429, together with the conductor layer 428, makes up the capacitor 63 of FIG. 3.

Figure 13:
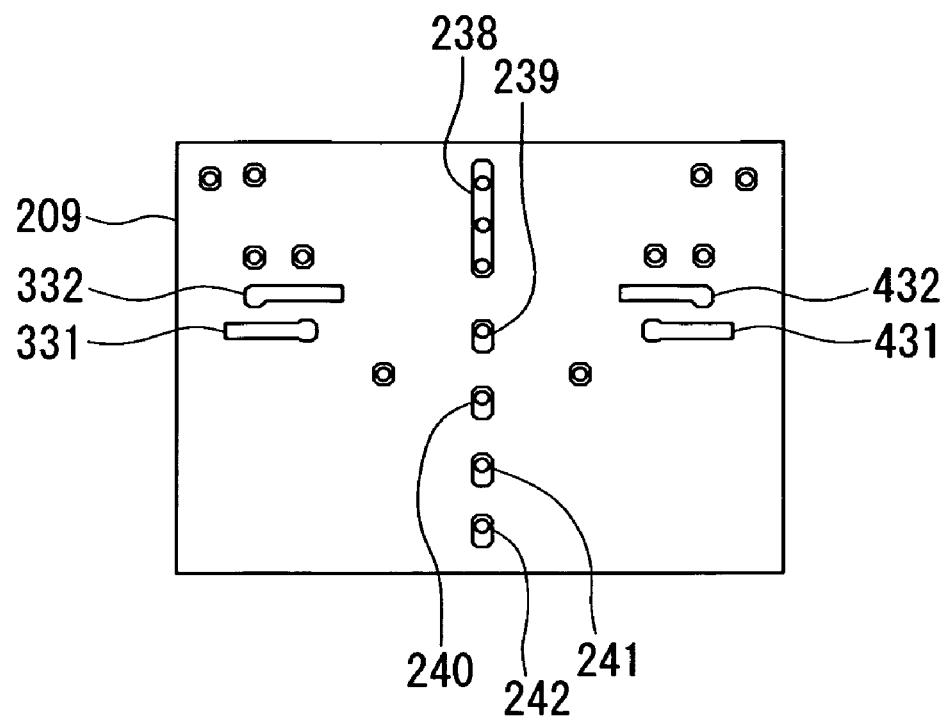
FIG. 13 is a top view illustrating a top surface of a ninth dielectric layer of the layered substrate of FIG. 1.

On the top surface of the ninth dielectric layer 209 of FIG. 13, conductor layers 238 to 242 for grounding and conductor layers 331, 332, 431 and 432 for capacitors are formed. The conductor layer 237 of FIG. 11 is connected to the conductor layers 238 to 242 via through holes formed in the dielectric layers 207 and 208.

The conductor layer 328 of FIG. 12 is connected to the conductor layer 331 via through holes formed in the dielectric layer 208. The conductor layer 329 of FIG. 12 is connected to the conductor layer 332 via through holes formed in the dielectric layer 208. The conductor layers 331 and 332 make up the capacitor 33 of FIG. 3.

The conductor layer 428 of FIG. 12 is connected to the conductor layer 431 via through holes formed in the dielectric layer 208. The conductor layer 429 of FIG. 12 is connected to the conductor layer 432 via through holes formed in the dielectric layer 208. The conductor layers 431 and 432 make up the capacitor 63 of FIG. 3.

Figure 14:
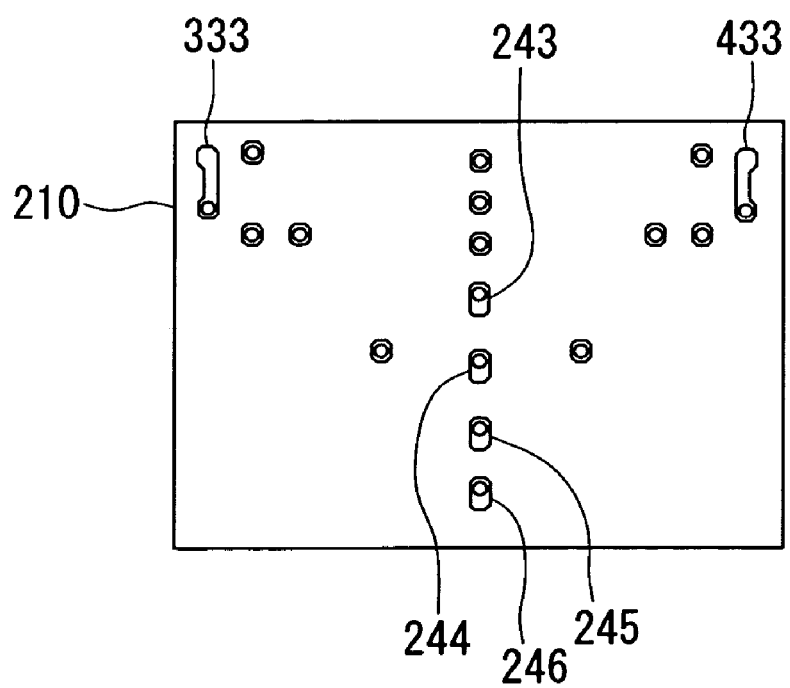
FIG. 14 is a top view illustrating a top surface of a tenth dielectric layer of the layered substrate of FIG. 1.

On the top surface of the tenth dielectric layer 210 of FIG. 14, conductor layers 243 to 246 for grounding and conductor layers 333 and 433 are formed. The conductor layers 239 to 242 of FIG. 13 are connected to the conductor layers 243 to 246 via through holes formed in the dielectric layer 209, respectively. The conductor layer 234 of FIG. 7 is connected to the conductor layers 333 and 433 via through holes formed in the dielectric layers 203 to 209.

Figure 15:
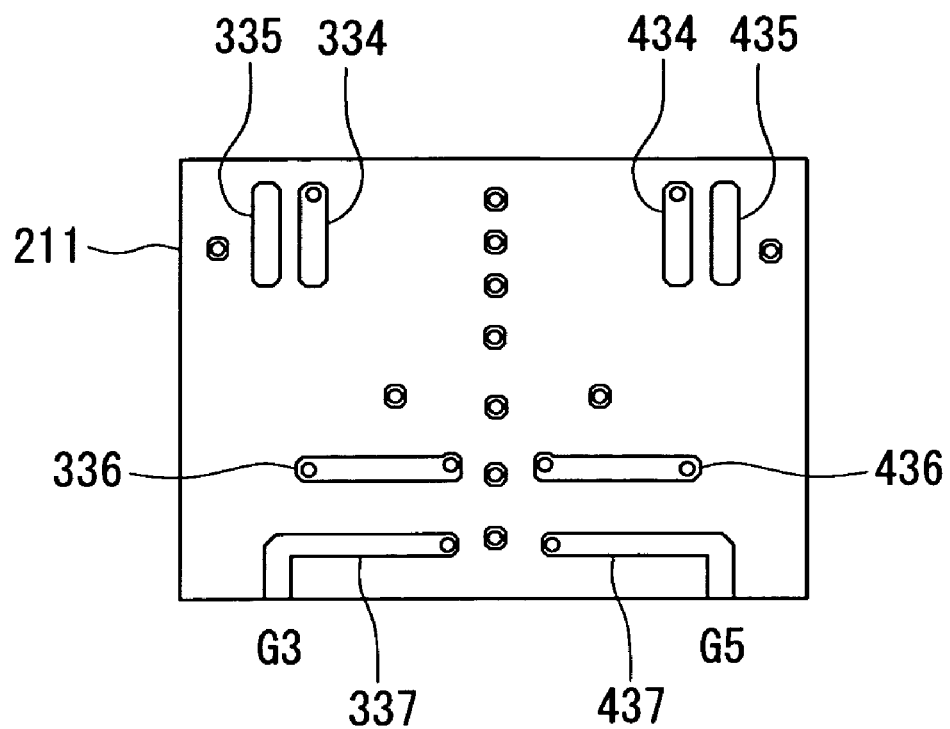
FIG. 15 is a top view illustrating a top surface of an eleventh dielectric layer of the layered substrate of FIG. 1.

On the top surface of the eleventh dielectric layer 211 of FIG. 15, conductor layers 334, 335, 336, 337, 434, 435, 436 and 437 are formed.

The conductor layer 328 of FIG. 12 is connected to the conductor layer 334 via through holes formed in the dielectric layers 208 to 210. The conductor layer 329 of FIG. 12 is connected to the conductor layer 335 via through holes formed in the dielectric layers 208 to 210. The conductor layer 234 of FIG. 7 is connected to the conductor layer 335 via through holes formed in the dielectric layers 203 to 210. The conductor layer 337 is connected to the terminal G3. The conductor layers 334, 335, 336 and 337 make up the transmission lines 31, 34, 21 and 24 of FIG. 3, respectively. The transmission lines 31, 34, 21 and 24 made up of the conductor layers 334, 335, 336 and 337 are distributed constant lines. In the embodiment the longitudinal direction of the transmission lines 21 and 24 (the conductor layers 336 and 337) that the resonant circuit of the BPF 20 includes and the longitudinal direction of the transmission lines 31 and 34 (the conductor layers 334 and 335) that the resonant circuit of the BPF 30 includes intersect at a right angle.

The conductor layer 428 of FIG. 12 is connected to the conductor layer 434 via through holes formed in the dielectric layers 208 to 210. The conductor layer 429 of FIG. 12 is connected to the conductor layer 435 via through holes formed in the dielectric layers 208 to 210. In addition, the conductor layer 234 of FIG. 7 is connected to the conductor layer 435 via through holes formed in the dielectric layers 203 to 210. The conductor layer 437 is connected to the terminal G5. The conductor layers 434, 435, 436 and 437 make up the transmission lines 61, 64, 51 and 54 of FIG. 3, respectively. The transmission lines 61, 64, 51 and 54 made up of the conductor layers 434, 435, 436 and 437 are distributed constant lines. In the embodiment the longitudinal direction of the transmission lines 51 and 54 (the conductor layers 436 and 437) that the resonant circuit of the BPF 50 includes and the longitudinal direction of the transmission lines 61 and 64 (the conductor layers 434 and 435) that the resonant circuit of the BPF 60 includes intersect at a right angle.

Figure 16:
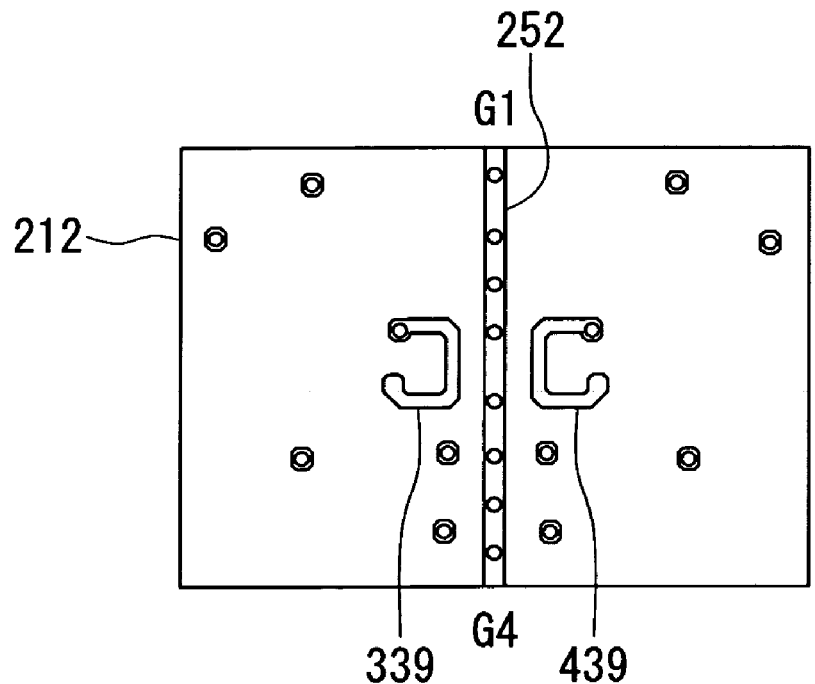
FIG. 16 is a top view illustrating a top surface of a twelfth dielectric layer of the layered substrate of FIG. 1.

On the top surface of the twelfth dielectric layer 212 of FIG. 16, a conductor layer 252 for grounding and conductor layers 339 and 439 for inductors are formed. The conductor layer 252 is connected to the terminals G1 and G4. The conductor layers 243 to 246 of FIG. 14 are connected to the conductor layer 252 via through holes formed in the dielectric layers 210 and 211. The conductor layer 238 of FIG. 13 is connected to the conductor layer 252 via through holes formed in the dielectric layers 209 to 211.

The conductor layer 324 of FIG. 11 is connected to the conductor layer 339 via through holes formed in the dielectric layers 207 to 211. The conductor layer 339 makes up a portion of the inductor 81 of FIG. 3. The conductor layer 424 of FIG. 11 is connected to the conductor layer 439 via through holes formed in the dielectric layers 207 to 211. The conductor layer 439 makes up a portion of the inductor 91 of FIG. 3.

Figure 17:
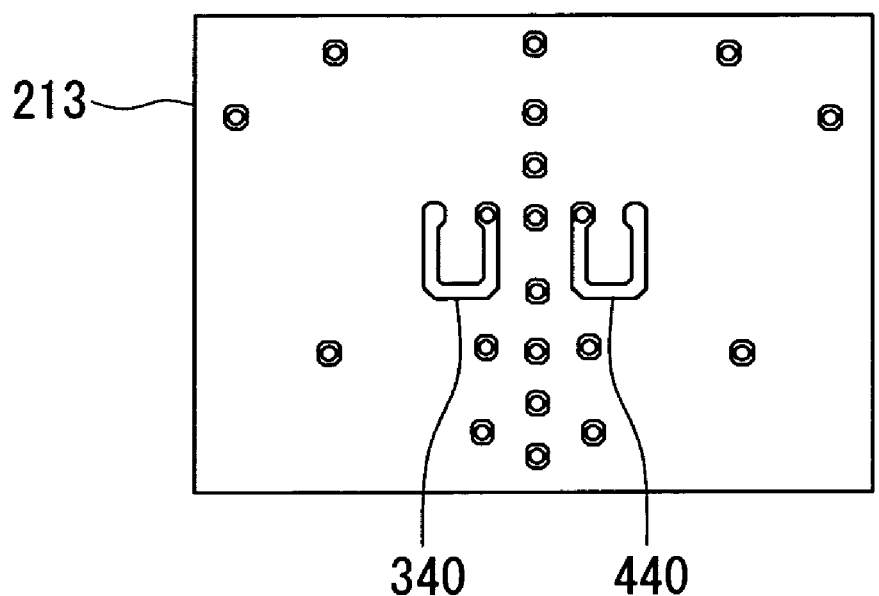
FIG. 17 is a top view illustrating a top surface of a thirteenth dielectric layer of the layered substrate of FIG. 1.

On the top surface of the thirteenth dielectric layer 213 of FIG. 17, conductor layers 340 and 440 for inductors are formed. The conductor layer 339 of FIG. 16 is connected to conductor layer 340 via a through hole formed in the dielectric layer 212. The conductor layer 340 makes up a portion of the inductor 81 of FIG. 3. The conductor layer 439 of FIG. 16 is connected to the conductor layer 440 via a through hole formed in the dielectric layer 212. The conductor layer 440 makes up a portion of the inductor 91 of FIG. 3.

Figure 18:
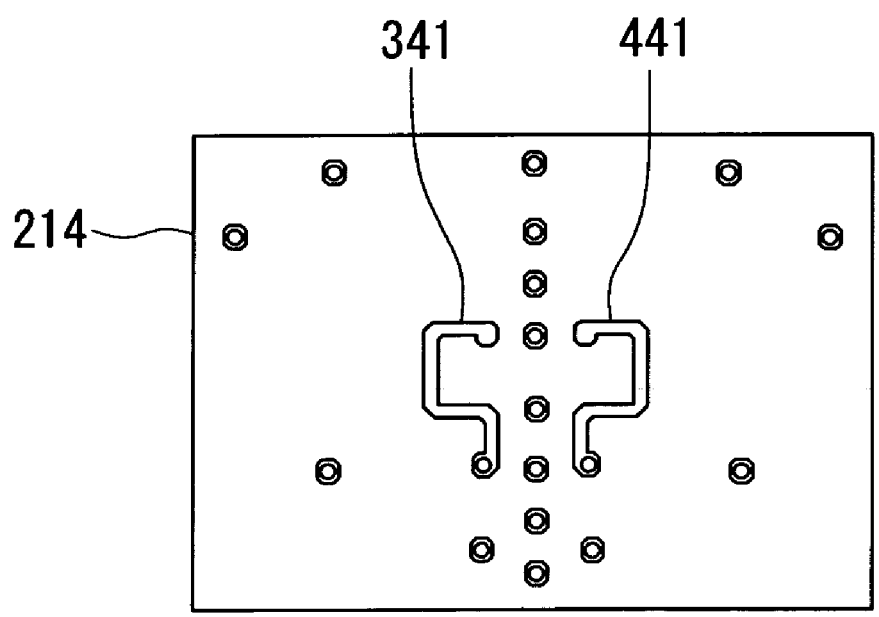
FIG. 18 is a top view illustrating a top surface of a fourteenth dielectric layer of the layered substrate of FIG. 1.

On the top surface of the fourteenth dielectric layer 214 of FIG. 18, conductor layers 341 and 441 for inductors are formed. The conductor layer 340 of FIG. 17 is connected to the conductor layer 341 via a through hole formed in the dielectric layer 213. The inductor 81 of FIG. 3 is made up of the conductor layers 339 to 341. The conductor layer 440 of FIG. 17 is connected to the conductor layer 441 via a through hole formed in the dielectric layer 213. The inductor 91 of FIG. 3 is made up of the conductor layers 439 to 441.

Figure 19:
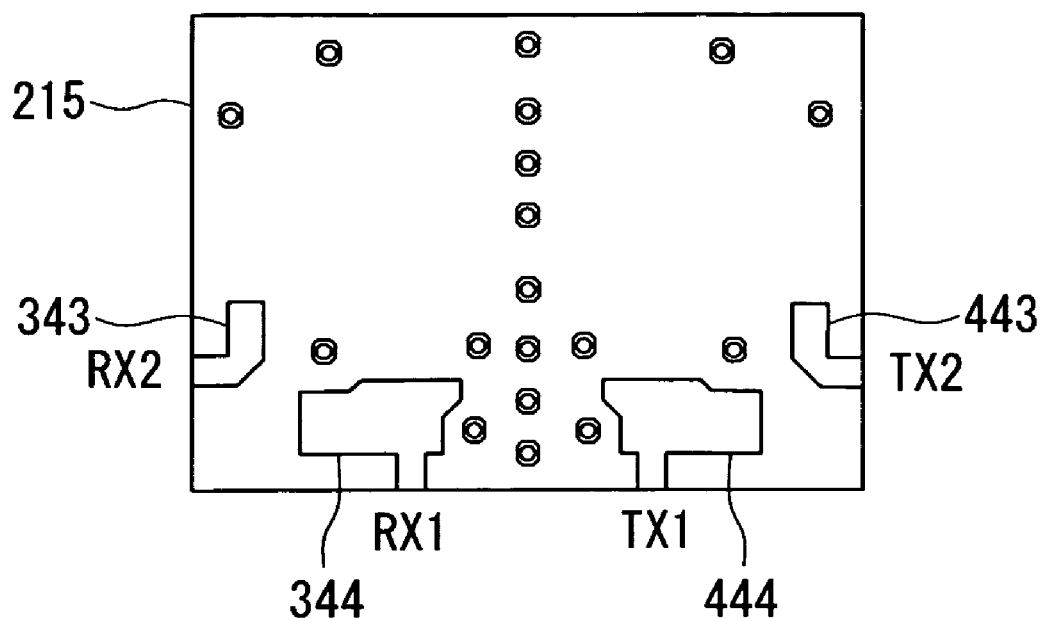
FIG. 19 is a top view illustrating a top surface of a fifteenth dielectric layer of the layered substrate of FIG. 1.

On the top surface of the fifteenth dielectric layer 215 of FIG. 19, conductor layers 343, 344, 443 and 444 for capacitors are formed. The conductor layer 343 is connected to the terminal RX2. The conductor layer 343 makes up a portion of the capacitor 44 of FIG. 3. The conductor layer 344 is connected to the terminal RX1. The conductor layer 344 makes up a portion of the capacitor 82 of FIG. 3. The conductor layer 443 is connected to the terminal TX2. The conductor layer 443 makes up a portion of the capacitor 74 of FIG. 3. The conductor layer 444 is connected to the terminal TX1. The conductor layer 444 makes up a portion of the capacitor 92 of FIG. 3.

Figure 20:
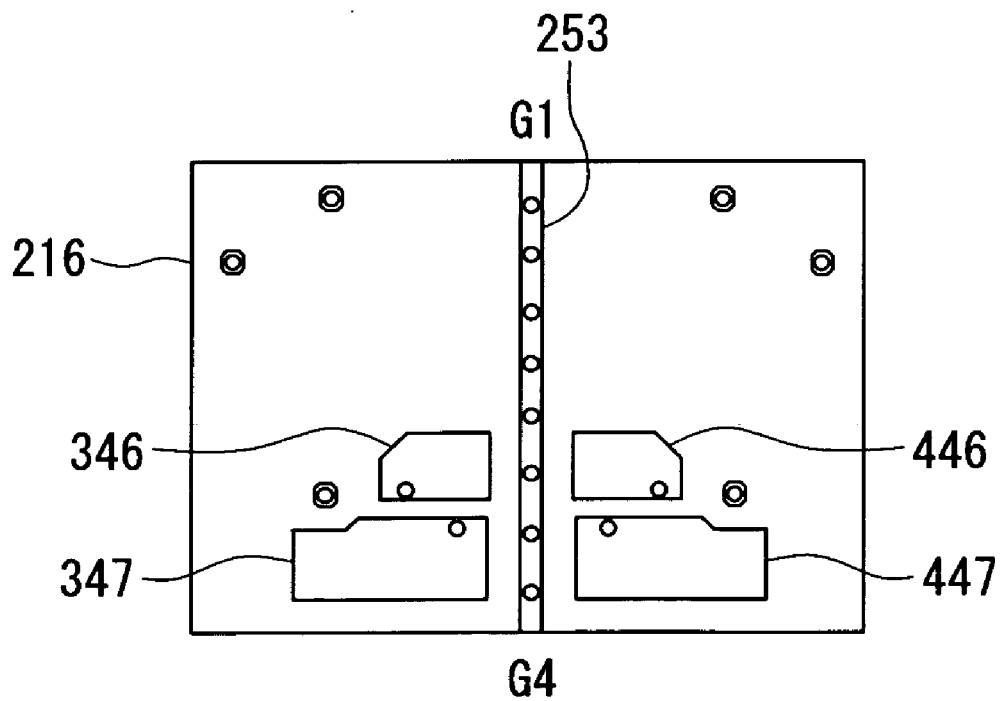
FIG. 20 is a top view illustrating a top surface of a sixteenth dielectric layer of the layered substrate of FIG. 1.

On the top surface of the sixteenth dielectric layer 216 of FIG. 20, a conductor layer 253 for grounding, conductor layers 346 and 446, and conductor layers 347 and 447 for capacitors are formed. The conductor layer 253 is connected to the terminals G1 and G4. The conductor layer 252 of FIG. 16 is connected to the conductor layer 253 via through holes formed in the dielectric layers 212 to 215.

The conductor layer 341 of FIG. 18 is connected to the conductor layer 346 via through holes formed in the dielectric layers 214 and 215. The conductor layer 346 makes up a portion of the capacitor 23 of FIG. 3. The conductor layer 337 of FIG. 15 is connected to the conductor layer 347 via through holes formed in the dielectric layers 211 to 215. The conductor layer 347, together with the conductor layer 344 of FIG. 19, makes up the capacitor 82 of FIG. 3. In addition, the conductor layer 347, together with the conductor layer 346, makes up the capacitor 23 of FIG. 3.

The conductor layer 441 of FIG. 18 is connected to the conductor layer 446 via through holes formed in the dielectric layers 214 and 215. The conductor layer 446 makes up a portion of the capacitor 53 of FIG. 3. The conductor layer 437 of FIG. 15 is connected to the conductor layer 447 via through holes formed in the dielectric layers 211 to 215. The conductor layer 447, together with the conductor layer 444 of FIG. 19, makes up the capacitor 92 of FIG. 3. In addition, the conductor layer 447, together with the conductor layer 446, makes up the capacitor 53 of FIG. 3.

Figure 21:
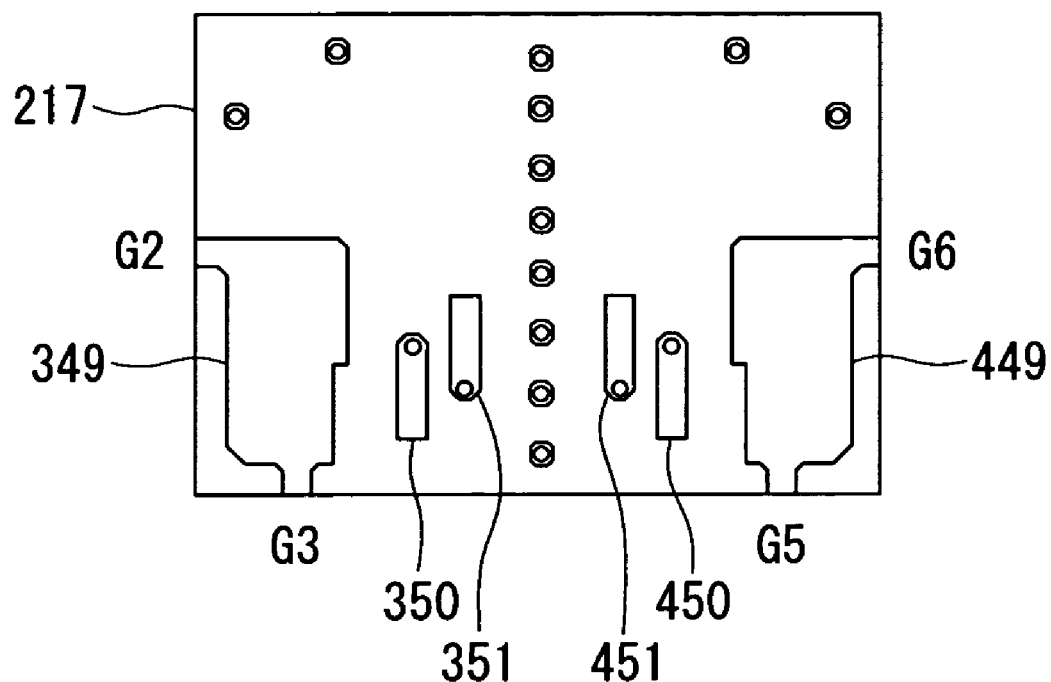
FIG. 21 is a top view illustrating a top surface of a seventeenth dielectric layer of the layered substrate of FIG. 1.

On the top surface of the seventeenth dielectric layer 217 of FIG. 21, conductor layers 349, 350, 351, 449, 450 and 451 for capacitors are formed.

The conductor layer 349 is connected to the terminals G2 and G3. The conductor layer 336 of FIG. 15 is connected to the conductor layer 349 via through holes formed in the dielectric layers 211 to 216. The conductor layer 349, together with the conductor layer 343 of FIG. 19, makes up the capacitor 44 of FIG. 3. The conductor layer 346 of FIG. 20 is connected to the conductor layer 350 via a through hole formed in the dielectric layer 216. The conductor layer 347 of FIG. 20 is connected to the conductor layer 351 via a through hole formed in the dielectric layer 216. The conductor layers 350 and 351 make up the capacitor 23 of FIG. 3.

The conductor layer 449 is connected to the terminals G5 and G6. The conductor layer 436 of FIG. 15 is connected to the conductor layer 449 via through holes formed in the dielectric layers 211 to 216. The conductor layer 449, together with the conductor layer 443 of FIG. 19, makes up the capacitor 74 of FIG. 3. The conductor layer 446 of FIG. 20 is connected to the conductor layer 450 via a through hole formed in the dielectric layer 216. The conductor layer 447 of FIG. 20 is connected to the conductor layer 451 via a through hole formed in the dielectric layer 216. The conductor layers 450 and 451 make up the capacitor 53 of FIG. 3.

Figure 22:
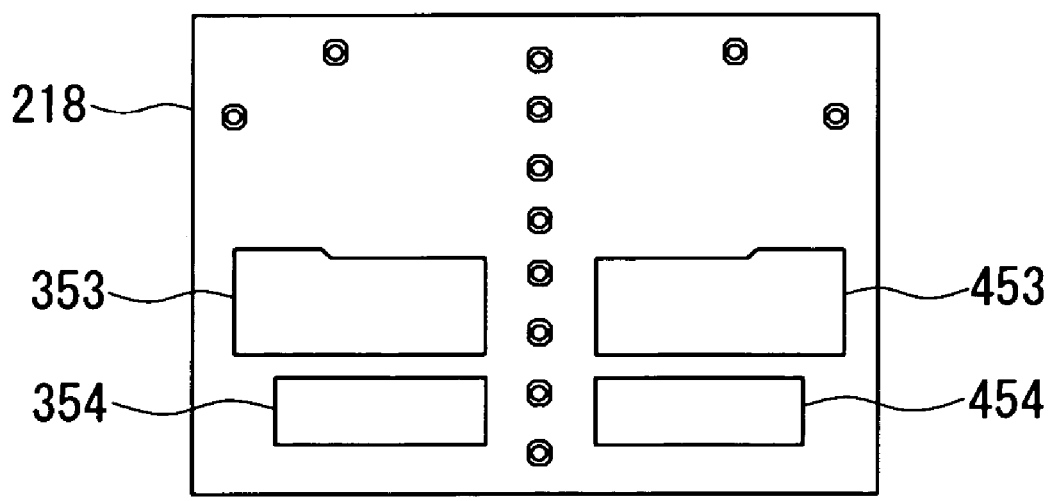
FIG. 22 is a top view illustrating a top surface of an eighteenth dielectric layer of the layered substrate of FIG. 1.

On the top surface of the eighteenth dielectric layer 218 of FIG. 22, conductor layers 353, 354, 453 and 454 for capacitors are formed.

The conductor layer 350 of FIG. 21 is connected to the conductor layer 353 via a through hole formed in the dielectric layer 217. The conductor layer 353 makes up a portion of the capacitor 22 of FIG. 3. The conductor layer 351 of FIG. 21 is connected to the conductor layer 354 via a through hole formed in the dielectric layer 217. The conductor layer 354 makes up a portion of the capacitor 25 of FIG. 3. The conductor layers 353 and 354 make up the capacitor 23 of FIG. 3.

The conductor layer 450 of FIG. 21 is connected to the conductor layer 453 via a through hole formed in the dielectric layer 217. The conductor layer 453 makes up a portion of the capacitor 52 of FIG. 3. The conductor layer 451 of FIG. 21 is connected to the conductor layer 454 via a through hole formed in the dielectric layer 217. The conductor layer 454 makes up a portion of the capacitor 55 of FIG. 3. The conductor layers 453 and 454 makes up the capacitor 53 of FIG. 3.

Figure 23:
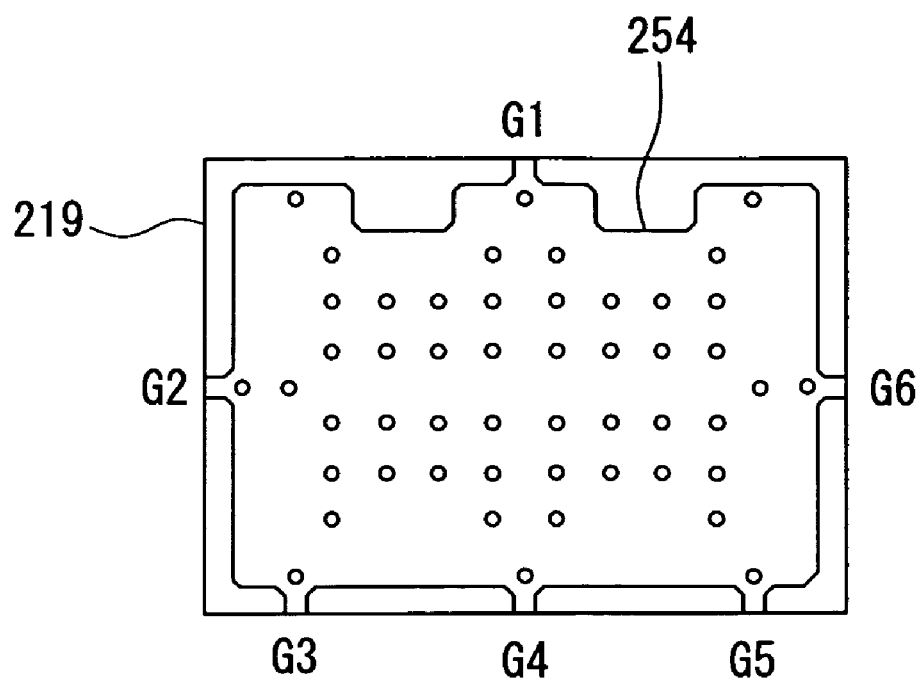
FIG. 23 is a top view illustrating a top surface of a nineteenth dielectric layer of the layered substrate of FIG. 1.

On the top surface of the nineteenth dielectric layer 219 of FIG. 23, a conductor layer 254 for grounding is formed. The conductor layer 254 is connected to the terminals G1 to G6. The conductor layer 254, together with the conductor layer 353 of FIG. 22, makes up the capacitor 22 of FIG. 3. In addition, the conductor layer 254, together with the conductor layer 354 of FIG. 22, makes up the capacitor 25 of FIG. 3. The conductor layer 254, together with the conductor layer 453 of FIG. 22, makes up the capacitor 52 of FIG. 3. The conductor layer 254, together with the conductor layer 454 of FIG. 22, makes up the capacitor 55 of FIG. 3.

The conductor layer 253 of FIG. 20 is connected to the conductor layer 254 via through holes formed in the dielectric layers 216 to 218. In addition, the conductor layers 334 and 434 of FIG. 15 are connected to the conductor layer 254 via through holes formed in the dielectric layers 211 to 218. Furthermore, the conductor layers 333 and 433 of FIG. 14 are connected to the conductor layer 254 via through holes formed in the dielectric layers 210 to 218. Fifty through holes are formed in the dielectric layer 219.

Figure 24:
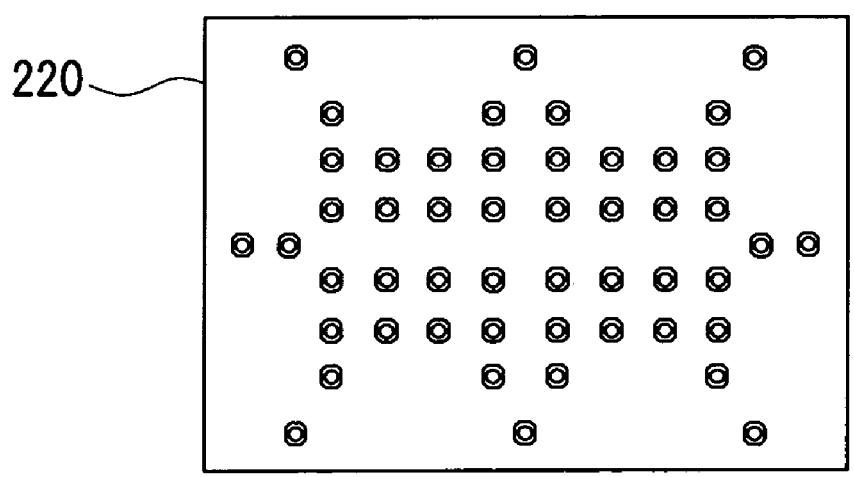
FIG. 24 is a top view illustrating a top surface of a twentieth dielectric layer of the layered substrate of FIG. 1.

The twentieth dielectric layer 220 of FIG. 24 has fifty through holes connected to the fifty through holes formed in the dielectric layer 219.

As shown in FIG. 25 and FIG. 26, conductor layers making up the terminals ANT1, ANT2, RX1, RX2, TX1, TX2, CT1 and CT2, and a conductor section 255 for grounding connected to the ground terminals G1 to G6 and to the terminals NC1 and NC2 are located on the lower surface of the dielectric layer 220, that is, the bottom surface of the layered substrate 200. The conductor layers making up the terminals and the conductor section 255 for grounding that are located on the bottom surface of the layered substrate 200 are bonded to a conductor layer of a mounting board through the use of a conductive bonding agent, for example, when the high frequency electronic component 1 is mounted on the mounting board.

The ground terminals G1 to G6, the terminals NC1 and NC2, and the conductor section 255 for grounding are made up of a single conductor layer. The ground terminals G1 to G6 and the terminals NC1 and NC2 are made up of portions of this conductor layer that have specific dimensions and that are located near the periphery of the bottom surface of the layered substrate 200. The conductor section 255 is made up of the remaining portion of the conductor layer. The conductor section 255 includes: a center portion 255A located in a region surrounded by the terminals; and coupling portions 255B1 to 255B8 for coupling the center portion 255A to the respective terminals G1 to G6, NC1 and NC2. In FIG. 25 and FIG. 26 the boundary between the center portion 255A and each of the coupling portions 255B1 to 255B8 is indicated with an alternate long and two short dashed line while the boundary between each of the coupling portions 255B1 to 255B8 and each of the terminals G1 to G6, NC1 and NC2 is indicated with a broken line. The center portion 255A is rectangle-shaped, for example. On the bottom surface of the layered substrate 200, all the terminals are arranged to surround the center portion 255A. The coupling portions 255B1 to 255B8 extend radially from the center portion 255A toward the terminals G1 to G6, NC1 and NC2. Although an example in which the center portion 255A is coupled to the terminals NC1 and NC2 is shown in FIG. 25 and FIG. 26, it is not absolutely necessary that the center portion 255A be coupled to the terminals NC1 and NC2.

The conductor layer 254 of FIG. 23 is connected to the terminals G1 to G6, NC1 and NC2, and the conductor section 255 via the through holes formed in the dielectric layers 219 and 220. In FIG. 25 the through holes formed in the dielectric layer 220 are indicated with dotted lines.

The area of the conductor section 255 for grounding that occupies the bottom surface of the layered substrate 200 is greater than the area of each of the terminals that occupies the bottom surface of the layered substrate 200.

As shown in FIG. 25, the terminals G1 to G6, NC1 and NC2, the center portion 255A, and the coupling portions 255B1 to 255B8 are respectively connected to the conductor layer 254 for grounding via separate through holes formed inside the layered substrate 200. The conductor layer 254 has an area greater than that of the center portion 255A.

The terminals ANT1, ANT2, RX1, RX2, TX1, TX2, CT1 and CT2 are those for inputting and outputting signals relating to functions of the circuit processing high frequency signals that is located inside the layered substrate 200. These terminals will be hereinafter called functional terminals. On the bottom surface of the layered substrate 200, each of the terminals G1 to G6, NC1 and NC2 is disposed between adjacent ones of the functional terminals.

In the embodiment the bottom surface of the layered substrate 200 is rectangle-shaped, and at least one of the ground terminals is disposed near each of the four sides of the bottom surface.

Figure 27:
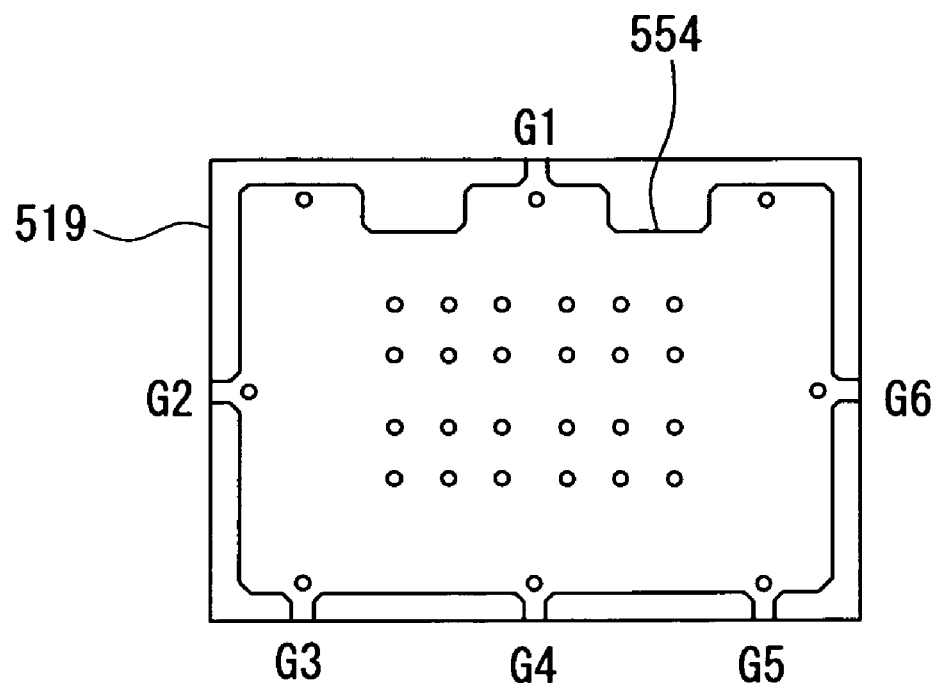
FIG. 27 is a top view illustrating a top surface of a nineteenth dielectric layer of a layered substrate of a reference high frequency electronic component compared with the first embodiment of the invention.
Figure 28:
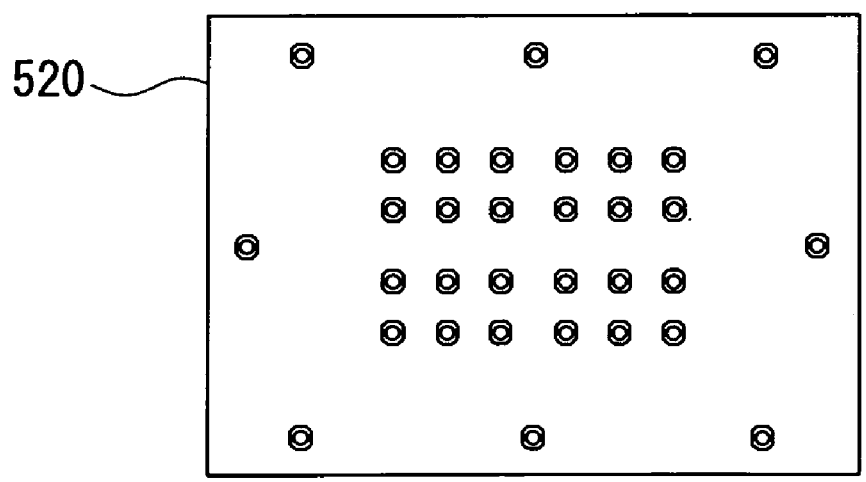
FIG. 28 is a top view illustrating a top surface of a twentieth dielectric layer of the layered substrate of the reference high frequency electronic component compared with the first embodiment of the invention.
Figure 29:
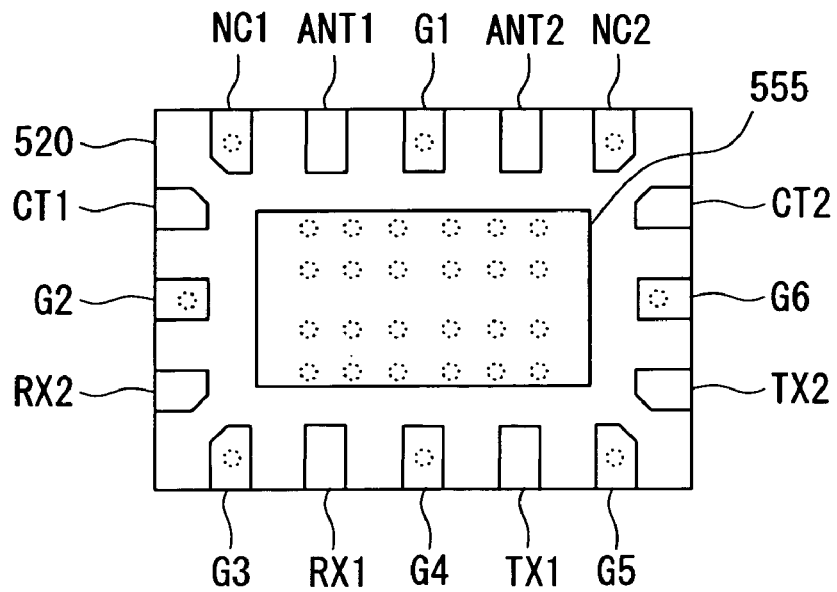
FIG. 29 is a top view illustrating the twentieth dielectric layer and conductor layers therebelow of the layered substrate of the reference high frequency electronic component compared with the first embodiment of the invention.

Features of the high frequency electronic component 1 of the embodiment will now be described, referring to a reference high frequency electronic component. FIG. 27 is a top view illustrating a top surface of a nineteenth dielectric layer of a layered substrate of the reference high frequency electronic component. FIG. 28 is a top view illustrating a top surface of a twentieth dielectric layer of the layered substrate of the reference high frequency electronic component. FIG. 29 illustrates the twentieth dielectric layer and conductor layers therebelow of the layered substrate of the reference high frequency electronic component seen from above. First to eighteenth dielectric layers and respective conductor layers thereabove of the layered substrate of the reference high frequency electronic component have configurations the same as those illustrated in FIG. 5 to FIG. 22.

As shown in FIG. 27, a conductor layer 554 for grounding is formed on the top surface of the nineteenth dielectric layer 519 of the reference high frequency electronic component. The conductor layer 554 has a shape the same as the conductor layer 254 of FIG. 23. The dielectric layer 519 has thirty-two through holes.

As shown in FIG. 28, the twentieth dielectric layer 520 of the reference electronic component has thirty-two through holes connected to the thirty-two through holes formed in the dielectric layer 519.

As shown in FIG. 29, conductor layers making up the terminals ANT1, ANT2, RX1, RX2, TX1, TX2, CT1, CT2, G1 to G6, NC1 and NC2, and a conductor section 555 for grounding are located on the lower surface of the dielectric layer 520, that is, the bottom surface of the layered substrate. The conductor section 555 is located in a region surrounded by the terminals. The conductor section 555 is not connected to the terminals G1 to G6, NC1 and NC2 on the bottom surface of the layered substrate.

The conductor layer 554 of FIG. 27 is connected to the terminals G1 to G6, NCl and NC2, and the conductor section 555 via the through holes formed in the dielectric layers 519 and 520. In FIG. 29 the through holes formed in the dielectric layer 520 are indicated with dotted lines. The terminals G1 to G6, NC1 and NC2, and the conductor section 555 are respectively connected to the conductor layer 554 for grounding via separate through holes.

In the embodiment of the invention, the terminals G1 to G6, NC1 and NC2 are connected to the conductor section 255 for grounding on the bottom surface of the layered substrate 200. As a result, it is possible to make the area of the bottom surface of the layered substrate 200 occupied by the portion bonded to the conductor layer of the mounting board greater, compared with the reference electronic component in which the terminals G1 to G6, NC1 and NC2 are separated from the conductor section 555 for grounding on the bottom surface of the layered substrate. As a result, according to the embodiment, it is possible to improve the strength of bonding between the high frequency electronic component 1 and the mounting board.

In the reference high frequency electronic component, if the ground terminals G1 to G6 are reduced in size, in particular, electrical connection between the conductor layer 554 and the ground terminals G1 to G6 is weakened, and it is therefore likely that the electrical potential of the conductor portions to be at the ground potential is nonuniform, the conductor portions including the ground terminals G1 to G6, the conductor section 555 and the conductor layer 554. In the embodiment, in contrast, the conductor section 255 is connected to the ground terminals G1 to G6 and to the conductor layer 254 via the though holes formed inside the layered substrate 200. As a result, according to the embodiment, the ground terminals G1 to G6, the conductor section 255 and the conductor layer 254 are electrically connected to one another firmly. It is thereby possible to improve the uniformity of electrical potential of the conductor portions to be at the ground potential, the conductor portions including the ground terminals G1 to G6, the conductor section 255 and the conductor layer 254.

In the embodiment the terminals G1 to G6, the center portion 255A, and the coupling portions 255B1 to 255B6 are connected to the conductor layer 254 for grounding via the separate through holes formed inside the layered substrate 200. In the embodiment, furthermore, it is possible to provide through holes for connecting the coupling portions 255B1 to 255B6 to the conductor layer 254. It is thereby possible to make the number of through holes for connecting the conductor section 255 to the conductor layer 254 greater, compared with the reference electronic component. According to the embodiment, it is thereby possible to further improve the uniformity of electrical potential of the conductor portions to be at the ground potential. In the embodiment the center portion 255A and the coupling portions 255B1 to 255B6 may be connected to the conductor layer 254 via separate through holes formed inside the layered substrate 200 without providing the through holes for connecting the ground terminals G1 to G6 to the conductor layer 254. In this case, it is also possible to improve the uniformity of electrical potential of the conductor portions to be at the ground potential, compared with the case in which the coupling portions 255B1 to 255B6 are not provided.

In the embodiment, each of the ground terminals G1 to G6 and the terminals NC1 and NC2 is disposed between adjacent ones of the functional terminals. As a result, it is possible to prevent electromagnetic interference between the respective adjacent ones of the functional terminals.

In the embodiment the area of the bottom surface of the layered substrate 200 that the conductor section 255 for grounding occupies is greater than the area of the bottom surface of the layered substrate 200 that each of the ground terminals G1 to G6 occupies. As a result, it is possible to further improve the strength of bonding between the high frequency electronic component 1 and the mounting board.

In the embodiment the bottom surface of the layered substrate 200 is rectangle-shaped, and at least one of the ground terminals is disposed near each of the four sides of the bottom surface. It is thereby possible to improve the strength of bonding between the high frequency electronic component 1 and the mounting board.

Figure 30:
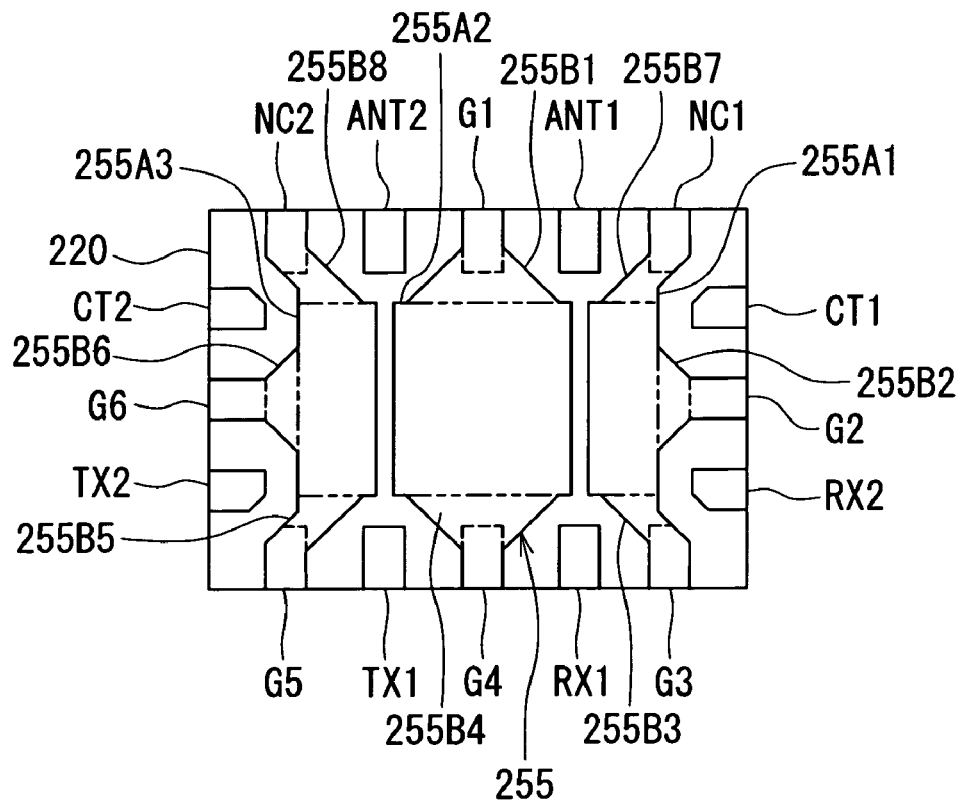
FIG. 30 is a bottom view of a layered substrate of a modification example of the first embodiment of the invention.

FIG. 30 is a bottom view of the layered substrate 200 of a modification example of the embodiment. In the modification example the center portion of the conductor section 255 for grounding is divided. FIG. 30 shows an example in which three center portions 255A1, 255A2 and 255A3 that are separated from one another are provided in place of the center portion 255A of FIG. 26. The center portion 255A1 is connected to the terminals NC1, G2 and G3 through coupling portions 255B7, 255B2 and 255B3, respectively. The center portion 255A2 is connected to the terminals G1 and G4 through coupling portions 255B1 and 255B4, respectively. The center portion 255A3 is connected to the terminals NC2, G6 and G5 through coupling portions 255B8, 255B6 and 255B5, respectively. It is possible to suppress deformation such as warp of the layered substrate 200 by dividing the center portion of the conductor section 255 as in this example. The center portion may be divided into two or four portions or more.

Second Embodiment

A high frequency electronic component of a second embodiment of the invention will now be described. The high frequency electronic component of the second embodiment is such one that an insulating layer covering the coupling portions 255B1 to 255B8 of the conductor section 255 for grounding is provided on the bottom surface of the layered substrate 200 of the high frequency electronic component of the first embodiment, so that the surfaces of the terminals G1 to G6, NC1 and NC2 are separated from the surface of the center portion 255A. FIG. 31 to FIG. 35 illustrate first to fifth examples of the form of the bottom surface of the layered substrate 200 of the second embodiment. Each of FIG. 31 to FIG. 35 is a bottom view of the layered substrate 200 of the high frequency electronic component 1 of the second embodiment. In each of FIG. 31 to FIG. 35 the insulating layer and portions of the terminals and the conductor section 255 that are not covered with the insulating layer are indicated with different types of hatching for convenience.

Figure 31:
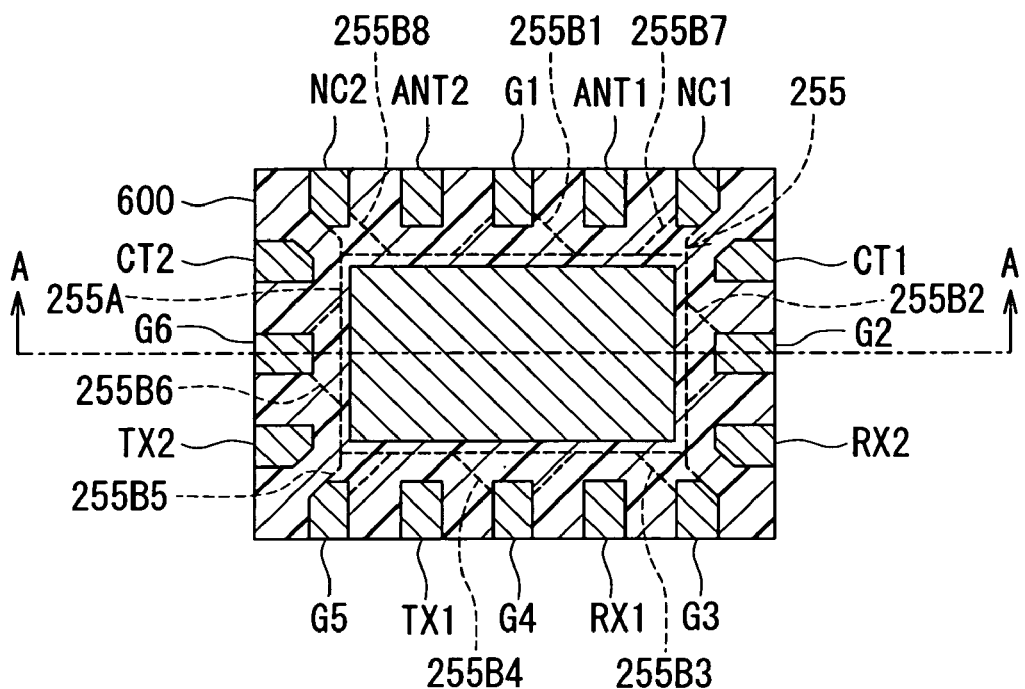
FIG. 31 is a bottom view illustrating a first example of form of a bottom surface of a layered substrate of a second embodiment of the invention.
Figure 32:
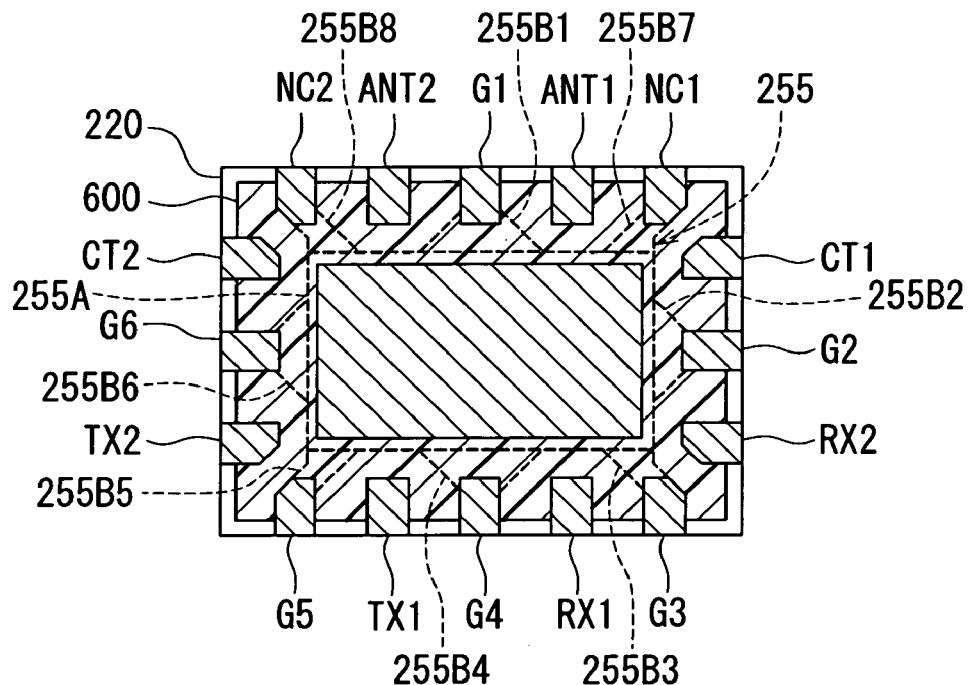
FIG. 32 is a bottom view illustrating a second example of form of the bottom surface of the layered substrate of the second embodiment of the invention.
Figure 33:
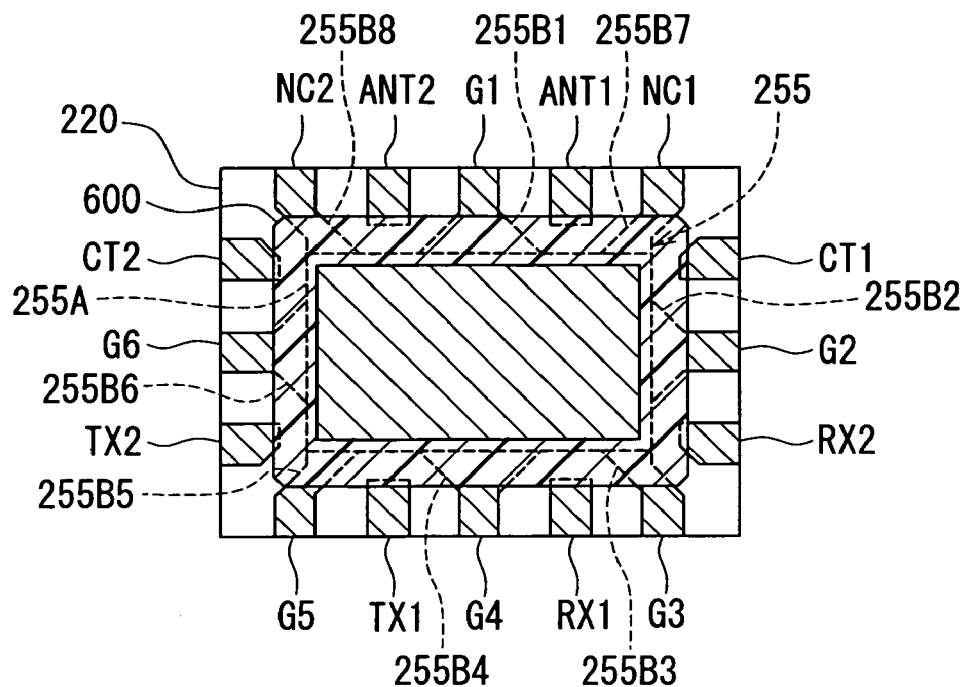
FIG. 33 is a bottom view illustrating a third example of form of the bottom surface of the layered substrate of the second embodiment of the invention.
Figure 34:
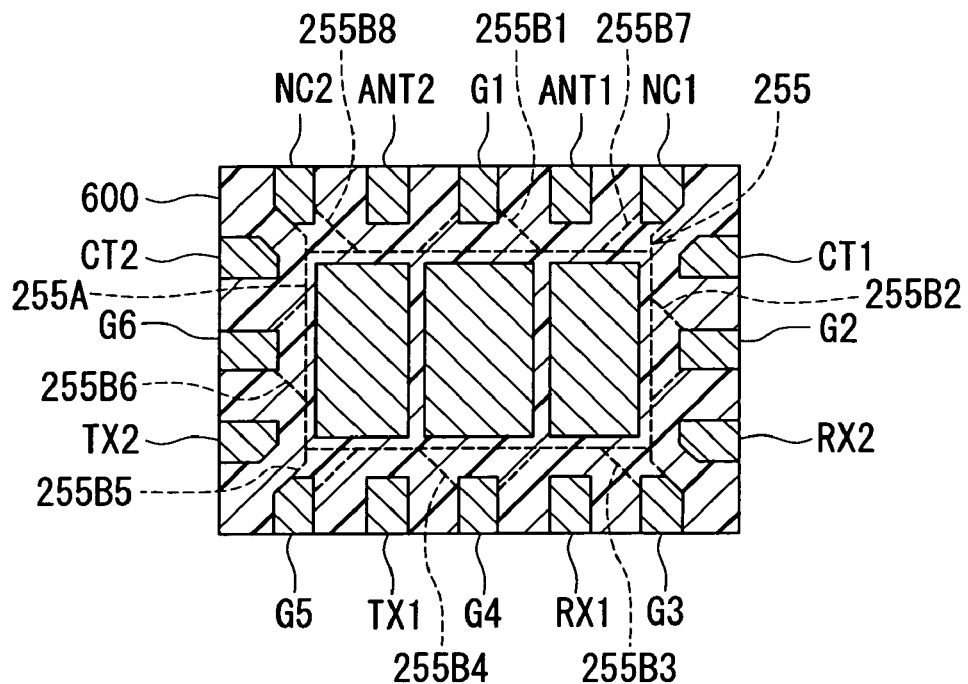
FIG. 34 is a bottom view illustrating a fourth example of form of the bottom surface of the layered substrate of the second embodiment of the invention.

FIG. 31 to FIG. 34 show examples in which the center portion 255A is made up of a single portion as shown in FIG. 26. In the example of FIG. 31, the insulating layer 600 provided on the bottom surface of the layered substrate 200 covers the bottom surface of the layered substrate 200 excluding the terminals and a major part of the center portion 255A of the conductor section 255. In the example of FIG. 32, the insulating layer 600 provided on the bottom surface of the layered substrate 200 covers the bottom surface of the layered substrate 200 excluding the terminals, a major part of the center portion 255A of the conductor section 255, and a portion of the bottom surface of the layered substrate 200 near the periphery thereof. In the example of FIG. 33, the insulating layer 600 provided on the bottom surface of the layered substrate 200 mainly covers the coupling portions 255B1 to 255B8 of the conductor section 255 of the bottom surface of the layered substrate 200. In the example of FIG. 34, the insulating layer 600 provided on the bottom surface of the layered substrate 200 covers the bottom surface of the layered substrate 200 excluding the terminals and a major part of the center portion 255A of the conductor section 255, as in the example of FIG. 31. In the example of FIG. 34, the insulating layer 600 covers part of the center portion 255A so that the region of the center portion 255A that is not covered with the insulating layer 600 is divided into three portions separated from one another.

Figure 35:
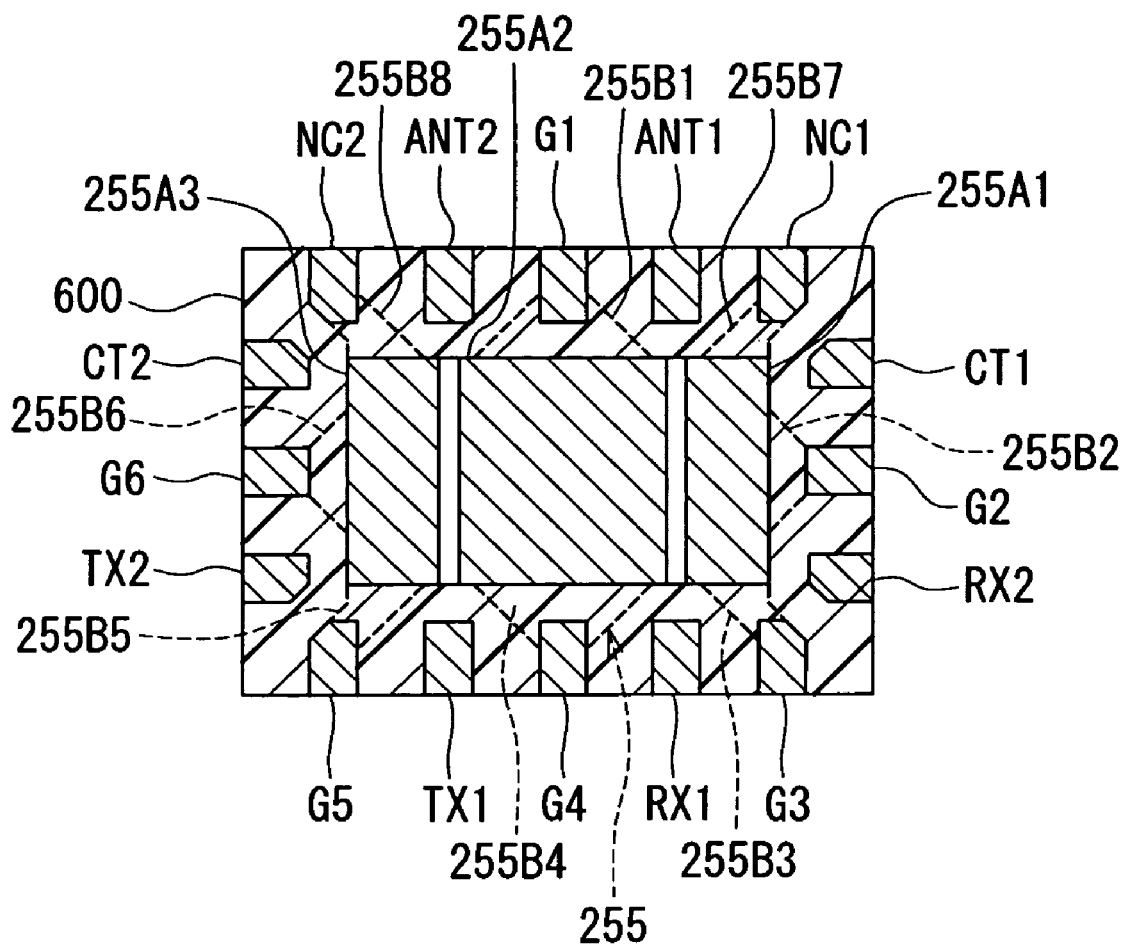
FIG. 35 is a bottom view illustrating a fifth example of form of the bottom surface of the layered substrate of the second embodiment of the invention.

FIG. 35 shows an example in which three center portions 255A1, 255A2 and 255A3 separated from one another are provided on the bottom surface of the layered substrate 200, as shown in FIG. 30. In the example of FIG. 35, the insulating layer 600 provided on the bottom surface of the layered substrate 200 covers the bottom surface of the layered substrate 200 excluding the terminals and a major part of the center portions 255A1, 255A2 and 255A3.

In each of the examples shown in FIG. 31 to FIG. 35, the insulating layer 600 may be made of glass or resin.

Figure 36:
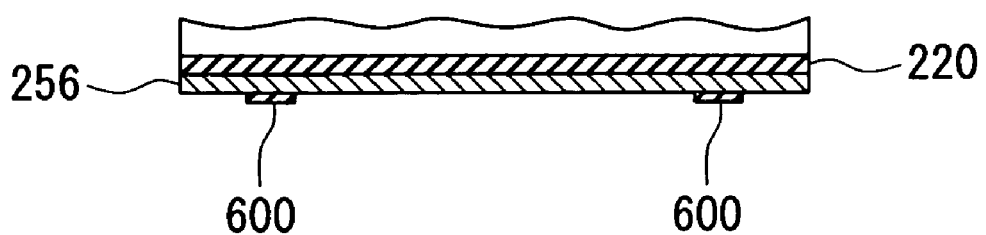
FIG. 36 is a cross-sectional view illustrating an example of cross section taken along line A-A of FIG. 31.

The form of the bottom surface of the layered substrate 200 of the second embodiment will now be described, using the example of FIG. 31. FIG. 36 illustrates an example of cross section taken along line A-A of FIG. 31. In FIG. 36 numeral 256 indicates a conductor layer forming the conductor section 255 and the terminals connected thereto. In this example the surface of the insulating layer 600 is located farther from the lower surface of the dielectric layer 220 than the surfaces of the portions of the terminals and the conductor section 255 that are not covered with the insulating layer 600. Even in this case, when the high frequency electronic component is mounted on the mounting board, it is possible to connect the terminals and the center portion 255A of the conductor section 255 of the high frequency electronic component to the conductor layer of the mounting board by placing a conductive bonding agent such as soldering paste on the conductor layer of the mounting board.

Figure 37:
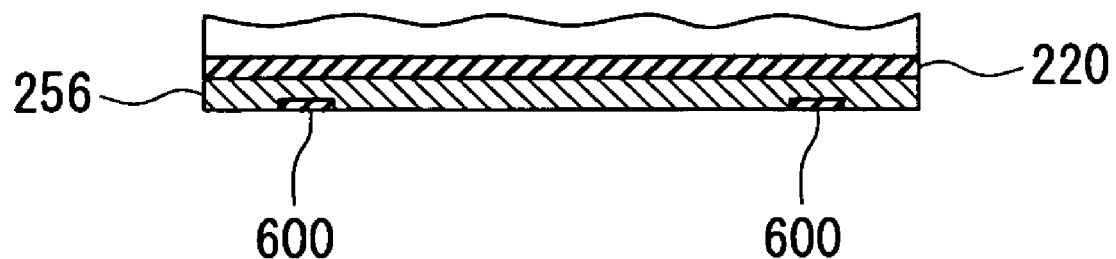
FIG. 37 is a cross-sectional view illustrating another example of cross section taken along line A-A of FIG. 31.

FIG. 37 illustrates another example of cross section taken along line A-A of FIG. 31. Also in FIG. 37 numeral 256 indicates a conductor layer forming the conductor section 255 and the terminals connected thereto. In this example a portion of the conductor layer 256 that is not covered with the insulating layer 600 is made thicker than the other portions, so that the surface of the insulating layer 600 and the surfaces of the portions of the terminals and the conductor section 255 that are not covered with the insulating layer 600 are made equal in height. In this case, the bottom surface of the high frequency electronic component is made flat, and it is therefore easy to connect the terminals and the center portion 255A of the conductor section 255 of the high frequency electronic component to the conductor layer of the mounting board. One of methods of varying the thicknesses of the conductor layer 256 from place to place is that a flat conductor layer is made, and then a film made of a material of the conductor layer is added to a portion of the conductor layer to be made thick. Another one of the methods is that a flat conductor layer is made, and then portions thereof are etched.

If the coupling portions 255B1 to 255B8 that are portions of the conductor portions to be at the ground potential are exposed at the bottom surface of the high frequency electronic component, defects may occur when the high frequency electronic component is mounted on the mounting board, such as contact of the coupling portions 255B1 to 255B8 to conductor layers other than the conductor layer for grounding of the mounting board. In the second embodiment, in contrast, the coupling portions 255B1 to 255B8 are covered with the insulating layer 600 on the bottom surface of the high frequency electronic component. As a result, according to the embodiment, it is possible to prevent defects which may occur if the coupling portions 255B1 to 255B8 were exposed at the bottom surface of the high frequency electronic component.

The remainder of configuration, function and effects of the second embodiment are similar to those of the first embodiment.

Third Embodiment

Figure 38:
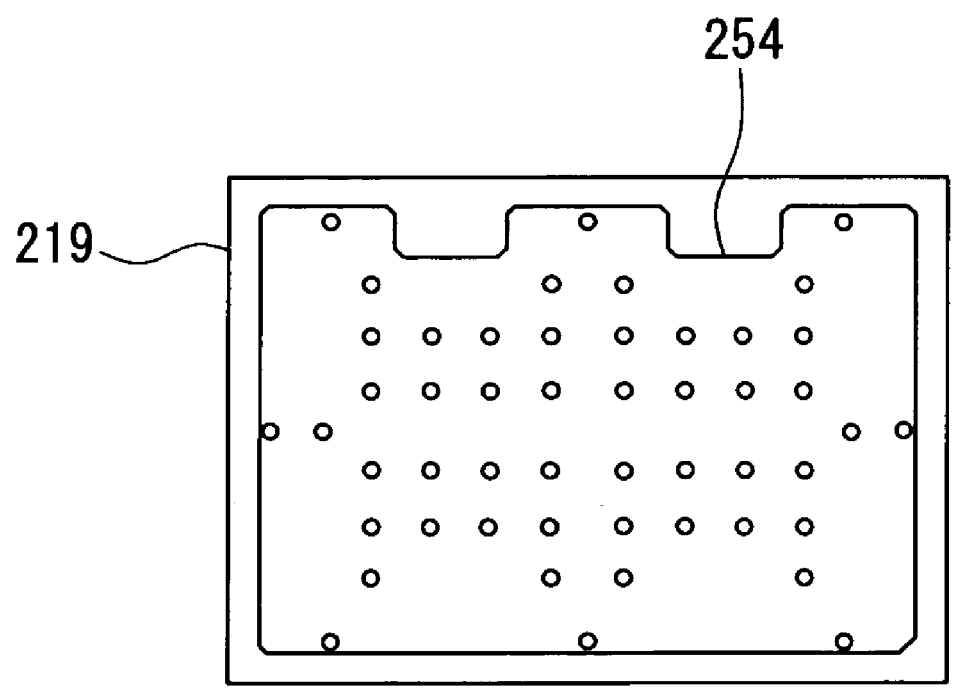
FIG. 38 is a top view illustrating a top surface of a nineteenth dielectric layer of a layered substrate of a third embodiment of the invention.
Figure 39:
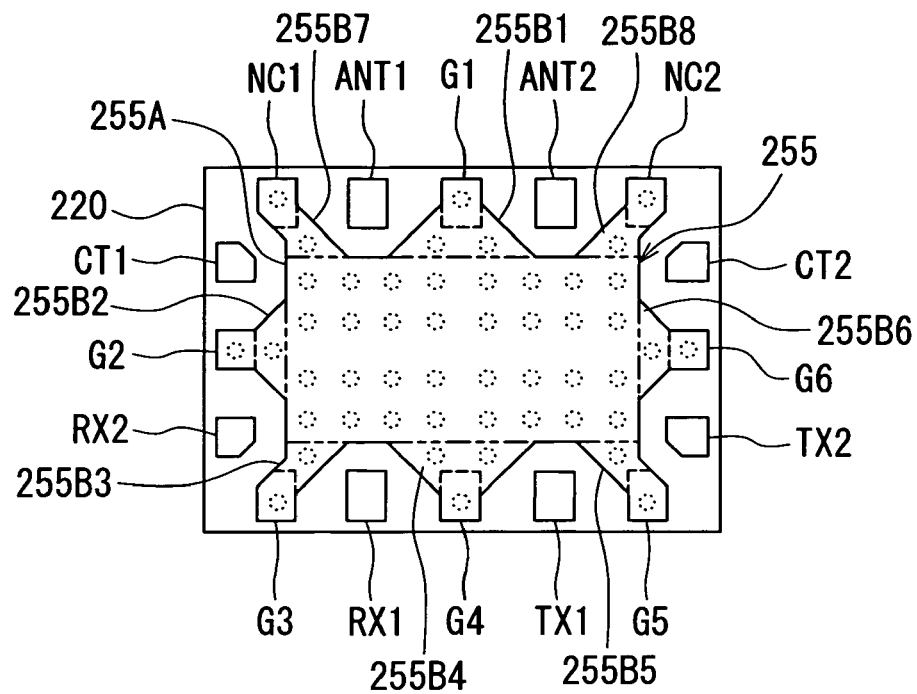
FIG. 39 is a top view illustrating a twentieth dielectric layer and conductor layers therebelow of the layered substrate of the third embodiment of the invention.
Figure 40:
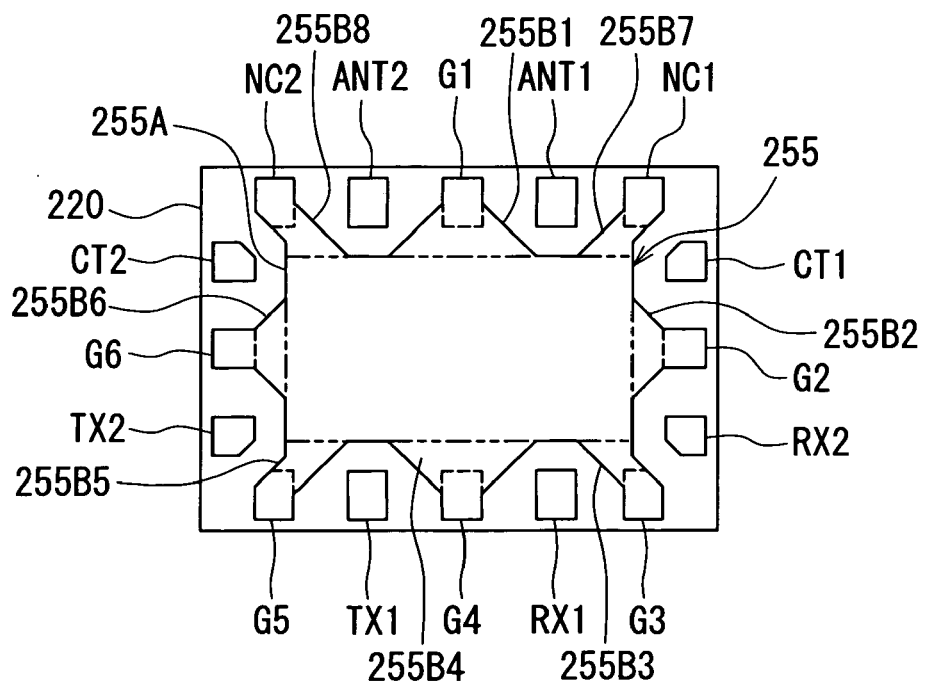
FIG. 40 is a bottom view of the layered substrate of the third embodiment of the invention.

A high frequency electronic component of a third embodiment of the invention will now be described. FIG. 38 is a top view illustrating a top surface of a nineteenth dielectric layer of a layered substrate of the third embodiment. FIG. 39 illustrates a twentieth dielectric layer and conductor layers therebelow of the layered substrate of the third embodiment seen from above. FIG. 40 is a bottom view of the layered substrate of the third embodiment.

In the third embodiment, as shown in FIG. 39 and FIG. 40, the terminals are located only on the bottom surface of the layered substrate 200 (the lower surface of the dielectric layer 220). The pattern of the conductor layers respectively located on the top surfaces of the first to eighteenth dielectric layers of the layered substrate 200 of the third embodiment may be such one that a plurality of conductor layers located at different levels are connected by using through holes in place of the terminals located on the side surfaces of the layered substrate 200 of the first embodiment.

In the third embodiment, as shown in FIG. 38, the periphery of the conductor layer 254 for grounding located on the top surface of the nineteenth dielectric layer 219 is located away from the periphery of the dielectric layer 219.

As shown in FIG. 39 and FIG. 40, the terminals located on the bottom surface of the layered substrate 200 (the lower surface of the dielectric layer 220) are located away from the periphery of the bottom surface of the layered substrate 200 (the lower surface of the dielectric layer 220).

The remainder of configuration, function and effects of the third embodiment are similar to those of the first embodiment including the modification example.

Fourth Embodiment

A high frequency electronic component of a fourth embodiment of the invention will now be described. The high frequency electronic component of the fourth embodiment is such one that the terminals are located only on the bottom surface of the layered substrate 200 (the lower surface of the dielectric layer 220) as in the third embodiment, and that an insulating layer covering the coupling portions 255B1 to 255B8 of the conductor section 255 for grounding are provided on the bottom surface of the layered substrate 200 as in the second embodiment.

Figure 41:
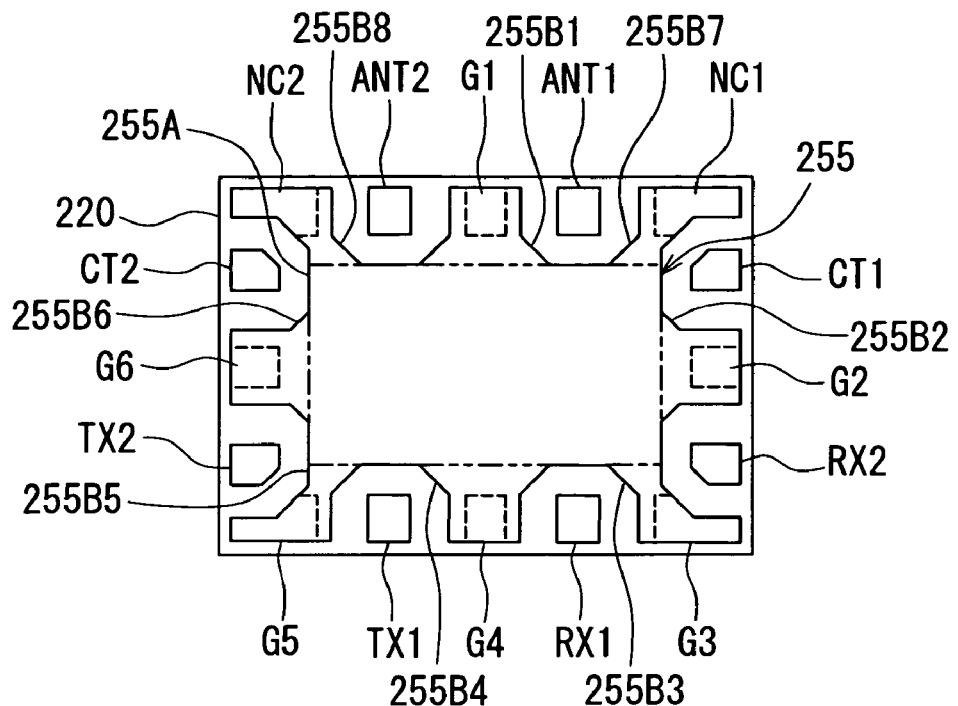
FIG. 41 is a bottom view of a layered substrate of a fourth embodiment of the invention from which an insulating layer is excluded.

FIG. 41 is a bottom view of the layered substrate 200 of the high frequency electronic component 1 of the fourth embodiment from which the insulating layer is excluded. As shown in FIG. 41, the terminals located on the bottom surface of the layered substrate 200 (the lower surface of the dielectric layer 220) are located away from the periphery of the bottom surface of the layered substrate 200 (the lower surface of the dielectric layer 220). The pattern of the conductor layers located on the lower surface of the dielectric layer 220 is slightly different from the pattern of the conductor layers shown in FIG. 40. The pattern of the other conductor layers of the layered substrate 200 is the same as that of the third embodiment.

Figure 42:
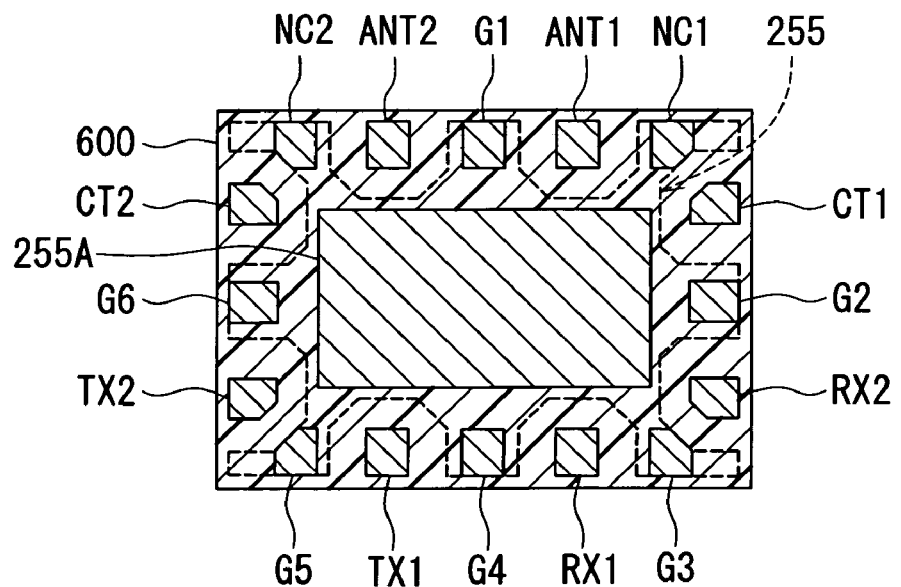
FIG. 42 is a bottom view of the layered substrate of the fourth embodiment.

FIG. 42 is a bottom view of the layered substrate 200 of the high frequency electronic component 1 of the fourth embodiment. In FIG. 42 the insulating layer and portions of the terminals and the conductor section 255 that are not covered with the insulating layer are indicated with different types of hatching for convenience. In the fourth embodiment, as shown in FIG. 42, the insulating layer 600 is provided on the bottom surface of the layered substrate 200. The insulating layer 600 covers the bottom surface of the layered substrate 200 excluding the terminals and a major part of the center portion 255A of the conductor section 255.

In the fourth embodiment the insulating layer 600 may have a shape the same as that of the insulating layer 600 shown in FIG. 32 to FIG. 34. Furthermore, as in the modification example of the first embodiment, the center portion of the conductor section 255 may be divided in the fourth embodiment, too.

The remainder of configuration, function and effects of the fourth embodiment are similar to those of the second or third embodiment.

The present invention is not limited to the foregoing embodiments but may be practiced in still other ways. For example, the circuit formed through the use of the layered substrate 200 in the invention is not limited to the ones disclosed in the embodiments, but it is possible to implement a variety of types of circuits for processing high frequency signals.

The invention is particularly useful for high frequency electronic components having an antenna switch function that requires a number of external terminals. Among such electronic components, the invention is specifically useful for antenna switch modules for a wireless LAN and antenna switch modules for cellular phones operable in multibands such as dual bands, triple bands and quad bands, these antenna switch modules requiring a greater number of external terminals and also requiring a reduction in size which is an important objective to be achieved.

Obviously many modifications and variations of the present invention are possible in the light of the above teachings. It is therefore to be understood that within the scope of the appended claims the invention may be practiced otherwise than as specifically described.

What is claimed is:

1. A high frequency electronic component comprising:
   a layered substrate including dielectric layers and conductor layers alternately stacked;
   a circuit for processing high frequency signals that is formed through the use of part of the conductor layers and located inside the layered substrate;
   a plurality of functional terminals for inputting and outputting signals relating to functions of the circuit; and
   a plurality of ground terminals connected to a ground, wherein:
   the conductor layers include a conductor layer for grounding located inside the layered substrate and connected to the ground;
   at least part of each of the functional terminals and at least part of each of the ground terminals are located on a bottom surface of the layered substrate;
   the high frequency electronic component further comprises a conductor section for grounding that is located on the bottom surface of the layered substrate and connected to the ground; and
   the conductor section for grounding includes: a center portion located in a region surrounded by the functional terminals and the ground terminals on the bottom surface of the layered substrate; and coupling portions for coupling the center portion to the ground terminals, and the conductor section for grounding is connected to the conductor layer for grounding via at least one through hole formed inside the layered substrate.

2. The high frequency electronic component according to claim 1, wherein: the center portion is rectangle-shaped; the functional terminals and the ground terminals are arranged to surround the center portion; and the coupling portions extend radially from the center portion toward the ground terminals.

3. The high frequency electronic component according to claim 1, wherein the center portion and the coupling portions are respectively connected to the conductor layer for grounding via separate through holes formed inside the layered substrate.

4. The high frequency electronic component according to claim 1, wherein the ground terminals, the center portion and the coupling portions are respectively connected to the conductor layer for grounding via separate through holes formed inside the layered substrate.

5. The high frequency electronic component according to claim 1, wherein the ground terminals are each located between respective adjacent ones of the functional terminals.

6. The high frequency electronic component according to claim 1, wherein an area of the conductor section for grounding that occupies the bottom surface of the layered substrate is greater than an area of each of the ground terminals that occupies the bottom surface of the layered substrate.

7. The high frequency electronic component according to claim 1, wherein the bottom surface of the layered substrate is rectangle-shaped, and at least one of the ground terminals is disposed near each of four sides of the bottom surface.

8. The high frequency electronic component according to claim 1, further comprising an insulating layer that is located on the bottom surface of the layered substrate and that covers the coupling portions so that surfaces of the ground terminals are separated from a surface of the center portion.

* * * * *